US012177587B2

(12) United States Patent
Kobayashi et al.

(10) Patent No.: US 12,177,587 B2
(45) Date of Patent: Dec. 24, 2024

(54) PHOTOELECTRIC CONVERSION APPARATUS, PHOTOELECTRIC CONVERSION SYSTEM, MOVING BODY, SEMICONDUCTOR SUBSTRATE, AND METHOD FOR DRIVING PHOTOELECTRIC CONVERSION APPARATUS

(71) Applicant: CANON KABUSHIKI KAISHA, Tokyo (JP)

(72) Inventors: Hideo Kobayashi, Tokyo (JP); So Hasegawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 17/537,282

(22) Filed: Nov. 29, 2021

(65) Prior Publication Data

US 2022/0182567 A1    Jun. 9, 2022

(30) Foreign Application Priority Data

Dec. 3, 2020  (JP) ................. 2020-201214

(51) Int. Cl.
*H04N 25/709* (2023.01)
*H04N 25/44* (2023.01)
(Continued)

(52) U.S. Cl.
CPC .......... *H04N 25/709* (2023.01); *H04N 25/44* (2023.01); *H04N 25/671* (2023.01); *G05F 1/573* (2013.01);
(Continued)

(58) Field of Classification Search
CPC ........................ H04N 25/441; H04N 25/709
See application file for complete search history.

(56) References Cited

U.S. PATENT DOCUMENTS

2010/0149392 A1*  6/2010  Hara ..................... H04N 25/445
                                                            348/300
2012/0199724 A1*  8/2012  Nomura ................. H04N 25/74
                                                            250/208.1
(Continued)

FOREIGN PATENT DOCUMENTS

JP       2008187565 A       8/2008
KR       20190070688 A  *   6/2019  ........... H04N 25/441
WO    WO-2020195824 A1  *  10/2020  ........ H01L 27/14621

OTHER PUBLICATIONS

Y. Berg & O. Mirmotahari, "Clocked Semi-Floating-Gate Ultra Low-Voltage Inverting Current Mirror", 2009 IEEE Int'l Soc Conf. 307-310 (Sep. 2009) (Year: 2009).*

(Continued)

*Primary Examiner* — David N Werner
(74) *Attorney, Agent, or Firm* — Canon U.S.A., Inc. IP Division

(57) ABSTRACT

An apparatus includes a plurality of pixels arranged in an array, a first group of pixels that are arranged in a first direction among the plurality of pixels, a first line to which the first group is connected, a second group of pixels that are arranged in the first direction among the plurality of pixels, and a second line to which the second group is connected. The first line is connected to a first source. The second line is connected to a second source. The apparatus further includes a control unit configured to: (1) perform control to increase a current flowing through the second source while performing control to decrease a current flowing through the first source, or (2) suppress a variation of total amount of (Continued)

flowing current by changing the current flowing through the second source in response to a change in the current flowing through the first source.

24 Claims, 18 Drawing Sheets

(51) Int. Cl.
  *H04N 25/671* (2023.01)
  *G05F 1/573* (2006.01)
  *H04N 25/441* (2023.01)
  *H04N 25/443* (2023.01)
  *H04N 25/445* (2023.01)
  *H04N 25/447* (2023.01)
  *H04N 25/531* (2023.01)
  *H04N 25/63* (2023.01)
  *H04N 25/75* (2023.01)

(52) U.S. Cl.
  CPC ........ *H03F 2200/78* (2013.01); *H04N 25/441* (2023.01); *H04N 25/443* (2023.01); *H04N 25/445* (2023.01); *H04N 25/447* (2023.01); *H04N 25/531* (2023.01); *H04N 25/63* (2023.01); *H04N 25/75* (2023.01)

(56) References Cited

U.S. PATENT DOCUMENTS

| | | | |
|---|---|---|---|
| 2014/0362277 A1* | 12/2014 | Kobuse | H04N 25/134 |
| | | | 348/349 |
| 2015/0156432 A1* | 6/2015 | Tozawa | H04N 25/447 |
| | | | 348/302 |
| 2016/0227141 A1* | 8/2016 | Kobayashi | H04N 25/44 |
| 2018/0152653 A1* | 5/2018 | Keel | H04N 25/77 |
| 2018/0205886 A1* | 7/2018 | Lee | H04N 25/42 |
| 2019/0029504 A1* | 1/2019 | Nadiv | H04N 25/709 |
| 2019/0037155 A1* | 1/2019 | Tanaka | H04N 25/441 |
| 2021/0227159 A1* | 7/2021 | Sambonsugi | H04N 25/778 |
| 2021/0356597 A1* | 11/2021 | Hurwitz | G01S 17/36 |
| 2022/0021833 A1* | 1/2022 | Berkovich | H04N 25/75 |
| 2022/0159208 A1* | 5/2022 | Machida | H01L 27/14645 |

OTHER PUBLICATIONS

J. Broskie, "Inverted Current Mirror", John Broskie's Guide to Tube Circuit Analysis & Design, Post No. 246 (Oct. 8, 2012) (Year: 2012).*

* cited by examiner

PHOTOELECTRIC CONVERSION APPARATUS, PHOTOELECTRIC CONVERSION SYSTEM, MOVING BODY, SEMICONDUCTOR SUBSTRATE, AND METHOD FOR DRIVING PHOTOELECTRIC CONVERSION APPARATUS

BACKGROUND

Field of the Disclosure

The aspect of the embodiments relates to a photoelectric conversion apparatus, a photoelectric conversion system including the photoelectric conversion apparatus, a moving body including the photoelectric conversion apparatus, a semiconductor substrate, and a method for driving the photoelectric conversion apparatus.

Description of the Related Art

Japanese Patent Application Laid-Open No. 2008-187565 discusses a solid-state image capturing apparatus in which a current value of a comparator disposed in each pixel column is switched depending on an analog-to-digital (AD) conversion gain of the comparator.

The solid-state image capturing apparatus discussed in Japanese Patent Application Laid-Open No. 2008-187565 has an issue where accuracy of an output signal from the solid-state image capturing apparatus deteriorates due to a variation of a power supply voltage.

SUMMARY

According to an aspect of the embodiments, an apparatus including a plurality of pixels arranged in an array includes a first group of pixels that are arranged in a first direction among the plurality of pixels, a first line to which the first group is connected, a second group of pixels that are arranged in the first direction among the plurality of pixels, and a second line to which the second group is connected. The first line is connected to a first source. The second line is connected to a second source. The apparatus further includes a control unit configured to: (1) perform control to increase a current flowing through the second source while performing control to decrease a current flowing through the first source, or (2) suppress a variation of a total amount of flowing current by changing the current flowing through the second source in response to a change in the current flowing through the first source.

According to another aspect of the embodiments, an apparatus includes a plurality of lines, a plurality of pixels each connected to one of the plurality of lines, a plurality of sources each connected to one of the plurality of lines, and a plurality of comparators each connected to one of the plurality of lines. The plurality of sources includes a first source and a second source. The plurality of comparators includes a first comparator and a second comparator. The second source is disposed between the first source and the first comparator. The first comparator is disposed between the second source and the second comparator.

According to yet another aspect of the embodiments, a substrate to be laminated on another substrate includes a first line connected to a first source, a second line connected to a second source, and a control unit configured to perform control to increase a current flowing through the second source while performing control to decrease a current flowing through the first source.

According to yet another aspect of the embodiments, a method for driving an apparatus, the method comprising increasing a current flowing through a second source during a period of decreasing a current flowing through a first source. The apparatus includes a plurality of pixels arranged in an array, a first group of pixels that are arranged in a first direction among the plurality of pixels, a first line to which the first group is connected, a second group of pixels that are arranged in the first direction among the plurality of pixels, and a second line to which the second group is connected. The first line is connected to the first source. The second line is connected to the second source.

Further features of the disclosure will become apparent from the following description of exemplary embodiments with reference to the attached drawings.

DESCRIPTION OF THE EMBODIMENTS

Exemplary embodiments of the present disclosure will be described below with reference to the drawings.

In the following exemplary embodiments, an image capturing apparatus will be mainly described as an example of a photoelectric conversion apparatus. However, the exemplary embodiments are not limited to the image capturing apparatus, but are also applicable to other examples of the photoelectric conversion apparatus. Examples of the photoelectric conversion apparatus include a ranging apparatus (e.g., an apparatus for distance measurement using focus detection or Time-of-Flight (ToF)) and a light metering apparatus (e.g., an apparatus for measuring the amount of incident light).

Figure 1:
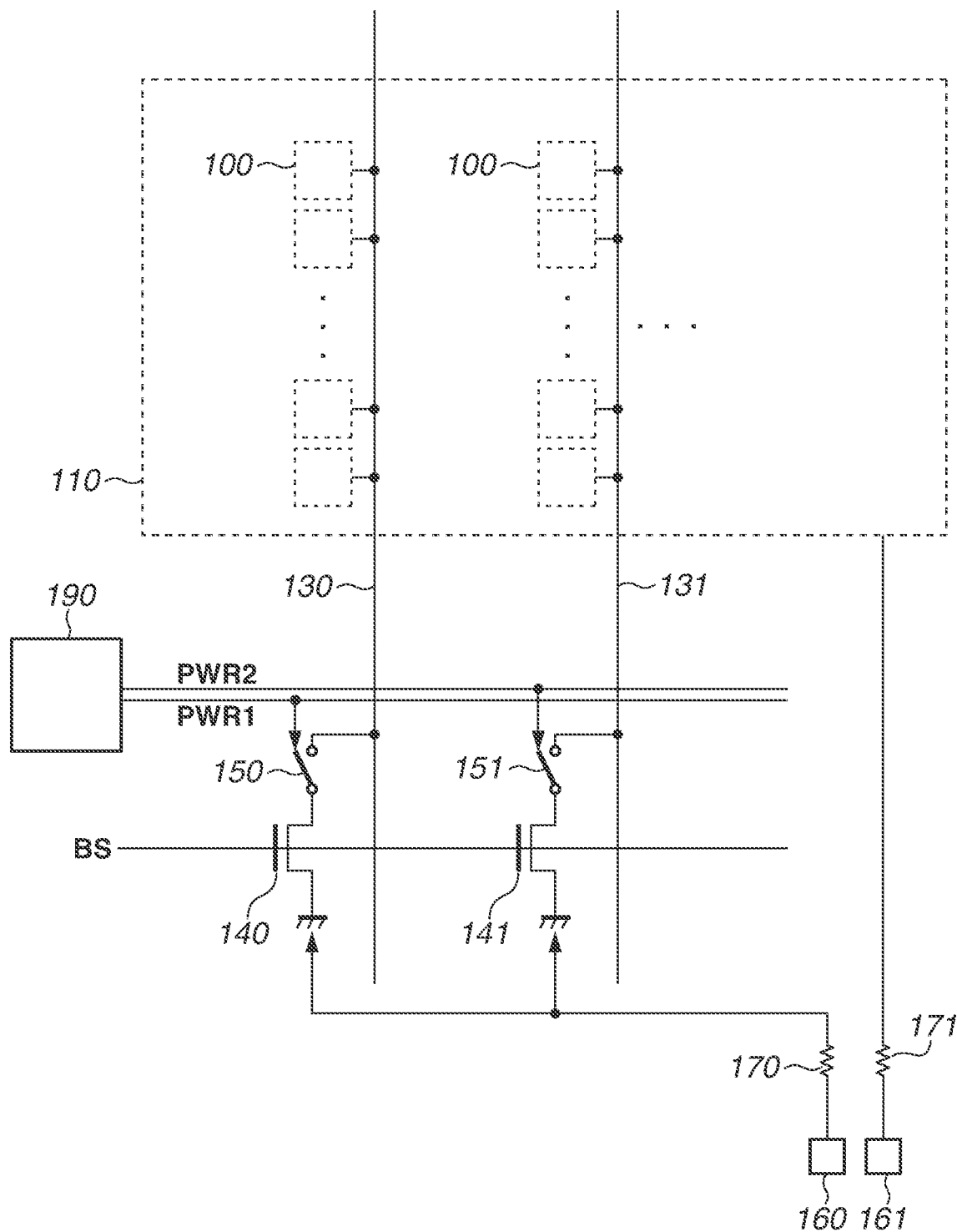
FIG. 1 is a schematic diagram illustrating a photoelectric conversion apparatus according to a first exemplary embodiment.
Figure 2:
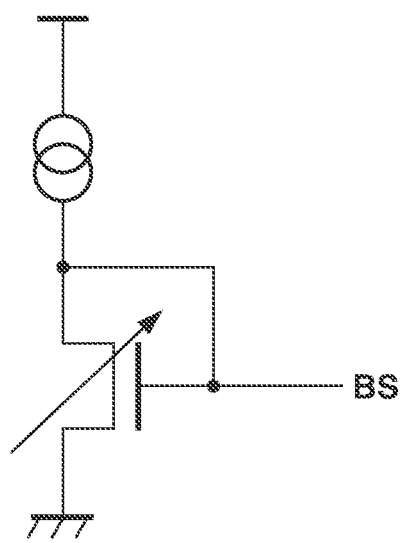
FIG. 2 is another schematic diagram illustrating the photoelectric conversion apparatus according to the first exemplary embodiment.
Figure 3:
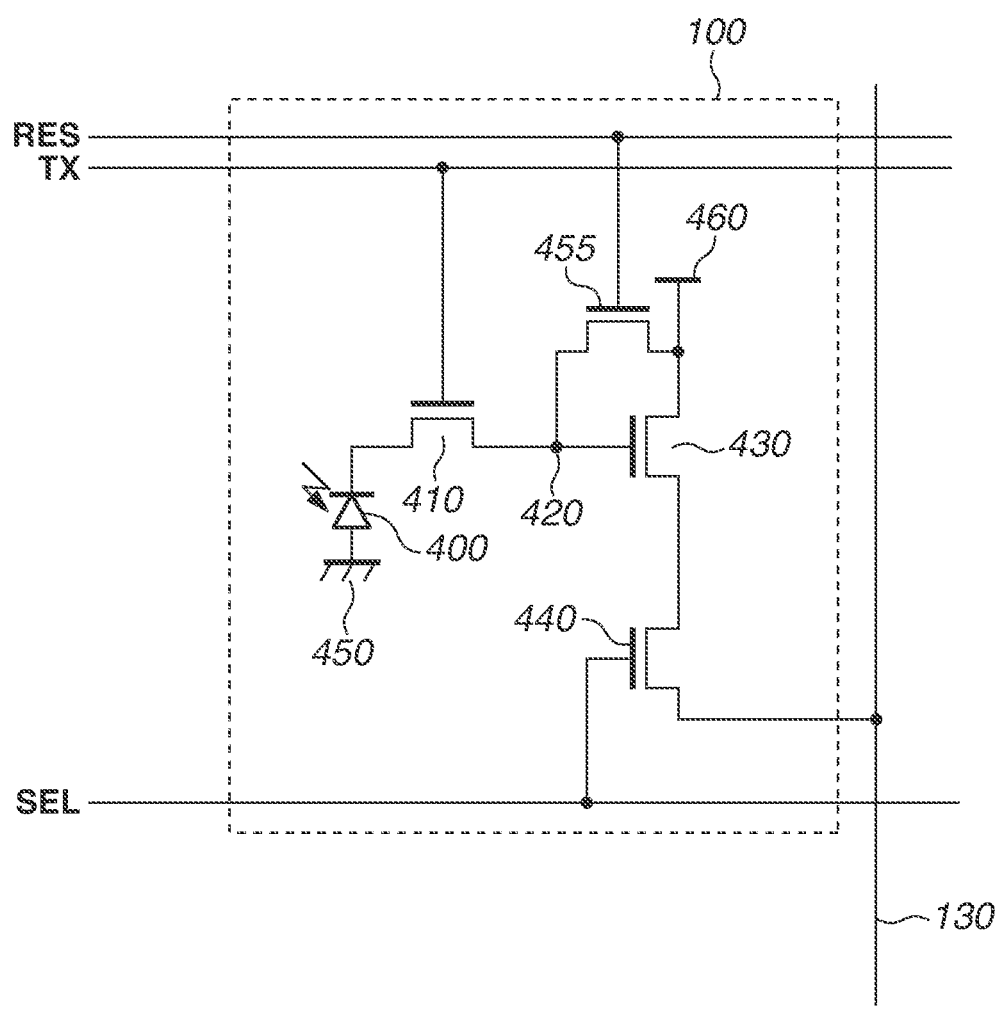
FIG. 3 is yet another schematic diagram illustrating the photoelectric conversion apparatus according to the first exemplary embodiment.

FIGS. 1 to 3 are schematic diagrams each illustrating a photoelectric conversion apparatus according to a first exemplary embodiment of the present disclosure.

The photoelectric conversion apparatus illustrated in FIG. 1 includes a pixel array 110, a vertical output line 130, a vertical output line 131, a current source transistor 140, a current source transistor 141, a switch 150, a switch 151, a ground (GND) pad 160, and a power supply pad 161. The photoelectric conversion apparatus also includes a control signal line PWR1, a control signal line PWR2, and a bias line BS. The photoelectric conversion apparatus further includes a resistor 170 and a resistor 171 as parasitic resistors.

The pixel array 110 includes a plurality of pixels 100 arranged in an array of a plurality of rows and a plurality of columns.

In each column of the pixel array 110, the vertical output line 130 or 131 extending in a column direction (a vertical direction illustrated in FIG. 1) is arranged. Each of the vertical output lines 130 and 131 is connected to the pixels 100 arranged in the column direction and forms a signal line common to the connected pixels 100.

The number of the pixels 100 constituting the pixel array 110 is not particularly limited. For example, the pixel array 110 may be formed of several thousands of rows of the pixels 100 and several thousands of columns of the pixels 100 like a general digital camera, or may be formed of a plurality of the pixels 100 arranged in one row.

Pixel signals read out from the pixels 100 are input to a column signal processing circuit (not illustrated) through the vertical output lines 130 and 131. The column signal processing circuit may include a memory for storing the pixel signals read out from the pixels 100. The pixel signals output from the column signal processing circuit are sequentially output on a column-by-column basis through a signal processing circuit (not illustrated).

A power supply voltage is supplied to the pixel array 110 through the power supply pad 161 and the resistor 171.

The GND pad 160 is connected to the ground at a ground potential. Hereinafter, the ground is also referred to as the GND.

The current source transistors 140 and 141 are supplied with the GND potential serving as a reference potential through the GND pad 160 and the resistor 170. A bias voltage is input from the bias line BS to the gate of each of the current source transistors 140 and 141. A bias source for supplying the bias voltage to the bias line BS includes, for example, a current source and a variable transistor illustrated in FIG. 2. The bias voltage corresponding to the size of the variable transistor is output to the bias line BS.

A current is supplied to the vertical output line 130 in response to an on or off state of the switch 150 connected to the control signal line PWR1. Similarly, a current is supplied to the vertical output line 131 in response to an on or off state of the switch 151 connected to the control signal line PWR2.

A timing generator 190 serving as a control unit controls signals to be output to the control signal lines PWR1 and PWR2. Accordingly, the timing generator 190 controls operations of the switch 150 and the switch 151. The timing generator 190 also controls driving of a signal readout operation for reading out signals from the pixels 100 in the pixel array 110, and driving of a signal processing operation using the column signal processing circuit and the signal processing circuit.

<Pixel Configuration>

A configuration of each of the pixels 100 according to the present exemplary embodiment will be described.

FIG. 3 is an equivalent circuit diagram illustrating a pixel circuit. One of the pixels 100 connected to the vertical output line 130 is taken as an example. Each of the pixels 100 includes a photodiode 400, a transfer transistor 410, a floating diffusion 420, a source follower transistor 430, a selection transistor 440, a GND node 450, a reset transistor 455, and a power supply node 460.

The photodiode 400 is grounded at the GND node 450. The photodiode 400 is connected to the transfer transistor 410. A control signal TX is input to the gate of the transfer transistor 410. The transfer transistor 410 includes a node in common with the reset transistor 455 and the source follower transistor 430. The common node corresponds to the floating diffusion 420. The reset transistor 455 and the source follower transistor 430 are each connected to the power supply node 460. A reset signal (or a control signal) RES is input to the gate of the reset transistor 455. The source follower transistor 430 is connected to the selection transistor 440, and a selection signal is input from a selection signal line SEL to the gate of the selection transistor 440. The selection transistor 440 is connected to the vertical output line 130.

<Functions of Pixel Elements>

Functions of elements of each of the pixels 100 will be described.

The photodiode 400 photoelectrically converts incident light to generate electric charge.

The electric charge generated through the photoelectric conversion by the photodiode 400 is transferred to the floating diffusion 420 through the transfer transistor 410, and is converted into a signal voltage by a parasitic capacitor associated with the floating diffusion 420. The signal voltage is input to the gate of the source follower transistor 430 and is output to the vertical output line 130 through the selection transistor 440. The source follower transistor 430 and the current source transistor 140 illustrated in FIG. 1 constitute a source follower, and the signal voltage on the floating diffusion 420 is output to the vertical output line 130 through the source follower.

<Driving of Photoelectric Conversion Apparatus>

The photoelectric conversion apparatus according to the present exemplary embodiment uses, as readout modes, an all pixels readout mode with a high resolution and a normal signal-to-noise (SN) ratio and a column thinning-out mode with a low resolution and a high SN ratio, and switches between these modes. By setting the amount of current consumption in the all pixels readout mode and the amount of current consumption in the column thinning-out mode to be substantially equal to each other, it is possible to suppress variations of a power supply voltage and a GND voltage serving as a reference voltage source and to improve the accuracy of an output signal from the photoelectric conversion apparatus.

A specific driving operation will be described next.

In the photoelectric conversion apparatus illustrated in FIG. 1, when the bias voltage to be supplied from the bias line BS to the current source transistors 140 and 141 is increased, a current to be supplied to each of the vertical output lines 130 and 131 is increased. This makes it possible to reduce 1/f noise generated in the source follower transistor 430 in each of the pixels 100 and improve the SN ratio.

In this case, when one of the control signal line PWR1 for controlling the switch 150 and the control signal line PWR2 for controlling the switch 151 is set to a low level, one of the switch 150 and the switch 151 can be turned off. A case where the switch 151 is turned off during a period in which the switch 150 is turned on will be described as an example. In this case, the vertical output line 131 is supplied with no current (which is referred to as a power saving state) and the readout mode is shifted to the column thinning-out mode in which no signals are read out from a pixel group of the pixels 100 connected to the vertical output line 131. In the column thinning-out mode, the resolution of an image based on the output signal decreases. However, the amount of data output from the pixel array 110 decreases, so that a data processing load at a subsequent stage can be reduced and power consumption can be reduced.

When the readout mode is switched as described above, the power supply voltage varies due to a variation of the amount of current consumption in each pixel column. If a signal is read out while such a variation occurs, the variation is superimposed on the signal as noise and the SN ratio of the output signal decreases.

To address this issue, in the present exemplary embodiment, the amount of current to be supplied from the current source transistor 140 to the vertical output line 130 is increased in the column thinning-out mode. More specifically, when the control unit switches the signal level of the control signal line PWR2 for determining the amount of current to be supplied to the vertical output line 131, the control unit changes the transistor size of the variable transistor in the bias source to change the bias voltage to be supplied to the current source transistors 140 and 141. By suppressing the variation of the total amount of current and suppressing the variations of the power supply voltage and the GND voltage when switching the readout mode, it is possible to suppress deterioration in image quality.

The driving of the photoelectric conversion apparatus will be described with reference to a timing diagram illustrated in FIG. 4.

First, at a time t0, signals input from the control signal lines PWR1 and PWR2 (which are also referred to as control signals PWR1 and PWR2) are set to a high level. A bias voltage is supplied from the common bias line BS to the gate of each of the current source transistors 140 and 141. The amount of current flowing through the current source transistor 140 is substantially equal to the amount of current flowing through the current source transistor 141.

During a period between the time t0 to a time t1, the signals from the pixels 100 in the pixel array 110 are sequentially read out row by row.

After the signals from all rows are read out, at the time t1, the control signal PWR2 is set to the low level to turn off the switch 151, so that the readout mode is shifted to the column thinning-out mode. Simultaneously at this time, the bias voltage to be supplied from the bias line BS to the gates of the current source transistors 141 and 140 is increased. This can suppress, when the readout mode is shifted to the column thinning-out mode, the variation of the total amount of current and the variation of the power supply voltage.

More specifically, the variation of the current flowing through the power supply pad 161, the resistor 171, the pixel array 110, the vertical output line 130, the current source transistor 140, the resistor 170, and the GND pad 160 in this order can be suppressed.

By suppressing the variation of the current, it is possible to suppress the variation of the power supply voltage at the power supply node 460 of each of the pixels 100 and the variation of the potential at the source node of each of the current source transistors 140 and 141. It is possible to suppress the deterioration in image quality due to interference of the variation of the potential at the power supply node 460 with the floating diffusion 420 through a capacitance between the drain and the gate of the source follower transistor 430. In this example, in order to prevent the variation of the total amount of current, in one embodiment, the value of the amount of increase in the current flowing through the current source transistor 140 is set to be as close as possible to the value of the amount of decrease in the current flowing through the current source transistor 141. However, a balance between the amount of increase in the current and the amount of decrease in the current can be determined depending on an allowable image quality.

Furthermore, by suppressing the variation of the potential at the source node of each of the current source transistors 140 and 141, it is possible to suppress the variation of the current flowing through the current source transistors 140 and 141 and to suppress deterioration of signals in the vertical output lines 130 and 131. The current source transistors 140 and 141 are the same circuit elements arranged adjacent to each other, and an impedance from the source node to the GND pad 160 is substantially equal and common between the current source transistors 140 and 141. Thus, the effect of suppressing the variation of the potential at the source node by suppressing the variation of the current can be enhanced.

As described above, the photoelectric conversion apparatus according to the present exemplary embodiment can suppress the variation of the power supply voltage in switching the readout mode. Furthermore, the photoelectric conversion apparatus can improve the SN ratio by suppressing the variation of the power supply voltage, thereby suppressing the deterioration in image quality.

While the example where the bias line BS is common to the gates of the current source transistors 140 and 141 and the control lines (the control signal lines PWR1 and PWR2) are provided for the switches 150 and 151, respectively, so that one of the current source transistors 140 and 141 is brought into the power saving state has been described with reference to FIG. 1, the configuration is not limited thereto. Bias lines may be separately provided for the respective gates of the current source transistors 140 and 141 and one of the current source transistors 140 and 141 may be brought into the power saving state. In this case, for example, a state of causing a small current of about 0.1 µA to flow without interrupting the supply of current may be set as the power saving state. By causing a small current to flow in the power saving state, it is possible to shorten the time for returning from the power saving state.

In the present exemplary embodiment, the timing generator 190 included in the photoelectric conversion apparatus controls the amount of current flowing through the current source transistors 140 and 141. In another example, a control unit provided outside the photoelectric conversion apparatus may control the current source transistors 140 and 141. For example, an overall control/calculation unit 1009 included in a photoelectric conversion system illustrated in FIG. 17 according to a sixth exemplary embodiment (described below) may control the current source transistors 140 and 141. More alternatively, the current source transistors 140 and 141 may be controlled externally outside the photoelectric conversion system illustrated in FIG. 17.

Figure 5:
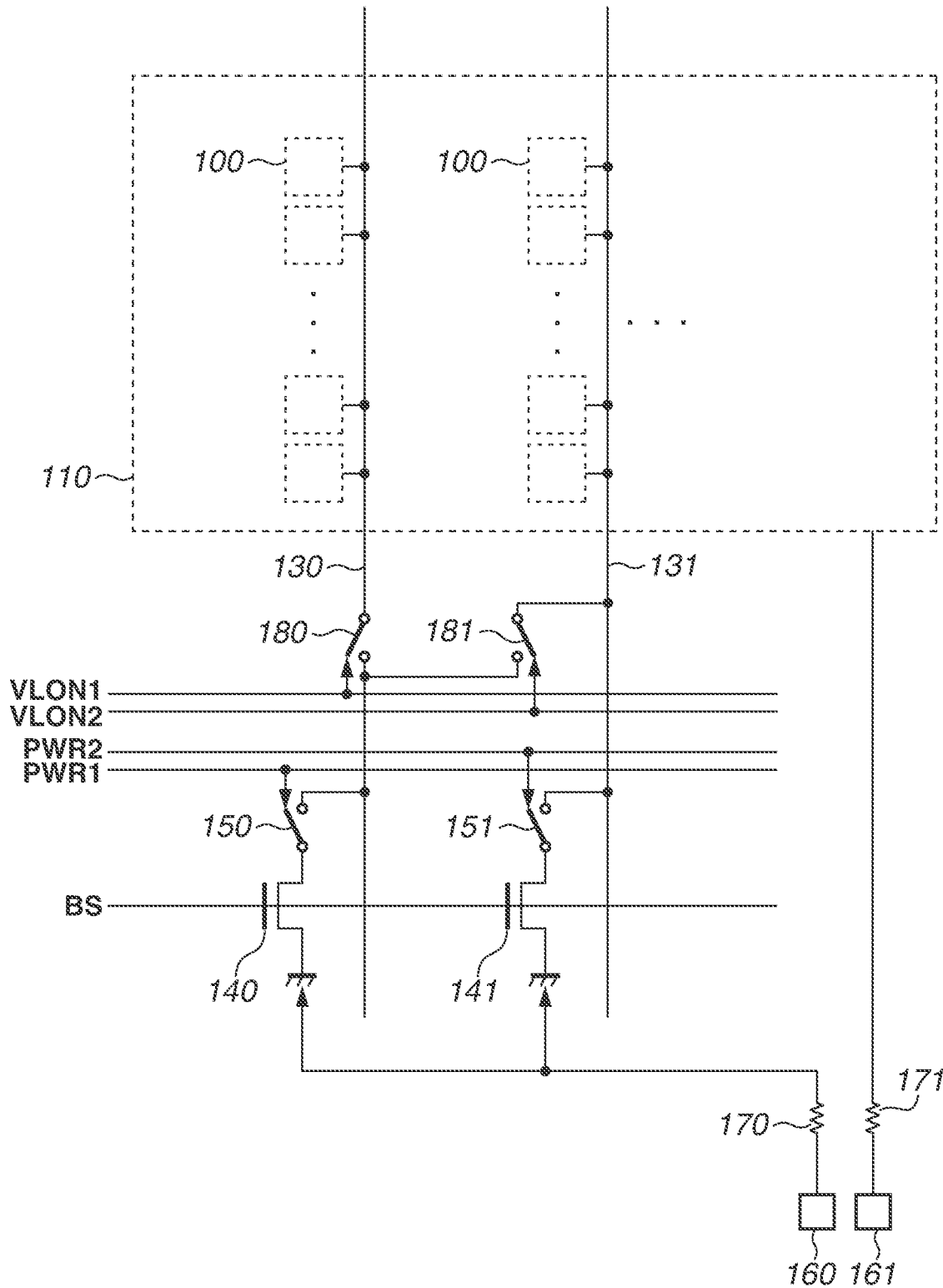
FIG. 5 is a schematic diagram illustrating a photoelectric conversion apparatus according to a second exemplary embodiment.

FIG. 5 schematically illustrates a photoelectric conversion apparatus according to a second exemplary embodiment. Descriptions of components similar to those according to the first exemplary embodiment will be omitted, and differences from the first exemplary embodiment will be mainly described.

The photoelectric conversion apparatus according to the present exemplary embodiment uses and switches between a high-speed mode with a normal SN ratio and a high SN mode with a low speed and a high SN ratio.

The vertical output lines 130 and 131 in the photoelectric conversion apparatus according to the present exemplary embodiment include switches 180 and 181, respectively. The vertical output line 130 is connected to a group of the pixels 100 arranged in even columns of the pixel array 110, and the vertical output line 131 is connected to a group of the pixels 100 arranged in odd columns of the pixel array 110. The switch 180 is controlled by a signal input from a control signal line VLON1 (which is also referred to as a control signal VLON1), and the switch 181 is controlled by a signal input from a control signal line VLON2 (which is also referred to as a control signal VLON2).

Figure 6:
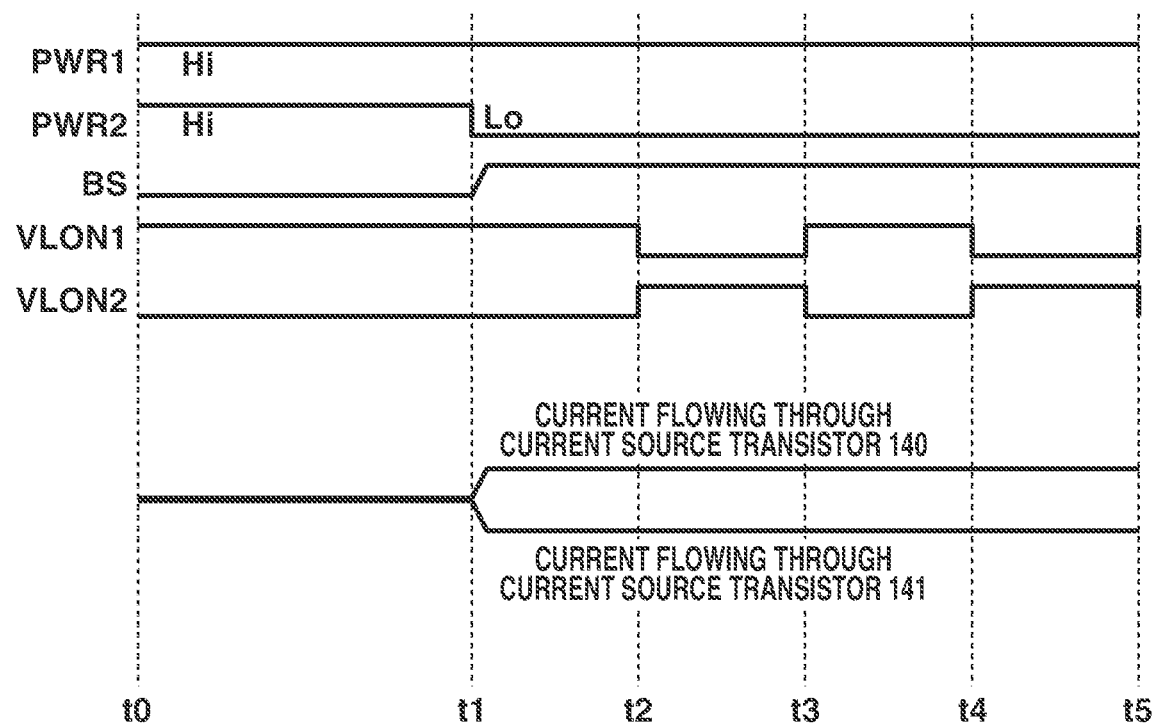
FIG. 6 is a timing diagram according to the second exemplary embodiment.

Driving of the photoelectric conversion apparatus will be described next with reference to a timing diagram illustrated in FIG. 6.

Figure 4:
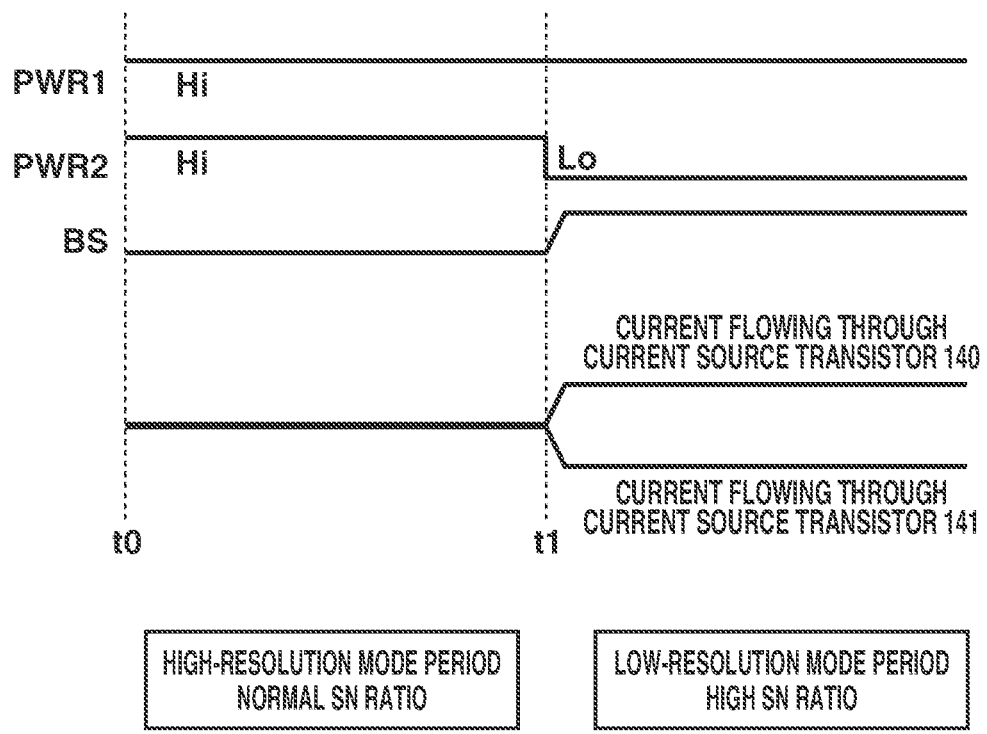
FIG. 4 is a timing diagram according to the first exemplary embodiment.

An operation during a period from a time t0 to a time t1 is similar to that illustrated in FIG. 4. At the time t0, the control signal VLON1 is at a high level and the switch 180 is turned on. The control signal VLON2 is at a low level and the switch 181 is turned off. Furthermore, the control signals PWR1 and PWR2 are set to the high level and the switches 150 and 151 are turned on. The currents flowing through the current source transistor 140 and 141 flow to the GND pad 160 through the vertical output lines 130 and 131, respectively, in substantially the same state. In this state, the signals from the pixels 100 in the pixel array 110 are sequentially read out row by row.

At the time t1, the control signal PWR2 is set to the low level to turn off the switch 151, so that the readout mode is shifted from the high-speed mode to the high SN mode. Simultaneously at this time, the bias voltage to be supplied from the bias line BS to the gate of each of the current source transistors 140 and 141 is increased. As a result, it is possible to suppress the variation of the total amount of current and the variation of the power supply voltage in shifting the readout mode.

During a period from the time t1 to a time t2, the control signal VLON1 is at the high level and the switch 180 is turned on. The control signal VLON2 is at the low level and the switch 181 is turned off. The current flowing through the current source transistor 140 flows through the vertical output line 130. In this state, the signals from the pixels 100 in the even columns of the pixel array 110 are read out through the vertical output line 130.

At the time t2, the control signal VLON1 is set to the low level and the switch 180 is turned off. The control signal VLON2 is set to the high level and the switch 181 is turned on.

The current flowing through the current source transistor 141 flows through the vertical output line 131. In this state, the signals from the pixels 100 in the odd columns of the pixel array 110 are read out through the vertical output line 131.

As described above, in the high SN mode, the signals from the pixels 100 in one row are read out in two steps during a period from the time t1 to a time t3. More specifically, the signals from the pixels 100 in the odd columns and the signals from the pixels 100 in the even columns are read out separately.

During a period from the time t3 to a time t5, the signals from the pixels 100 in the next row are further read out by a similar operation.

By such a driving operation, in the present exemplary embodiment, it is possible to read out the signals without decreasing the resolution in the high SN mode. Furthermore, it is possible to suppress the variation of the power supply voltage in shifting the readout mode from the high-speed mode to the high SN mode, thereby suppressing the deterioration in image quality due to the variation of the power supply voltage.

Figure 7:
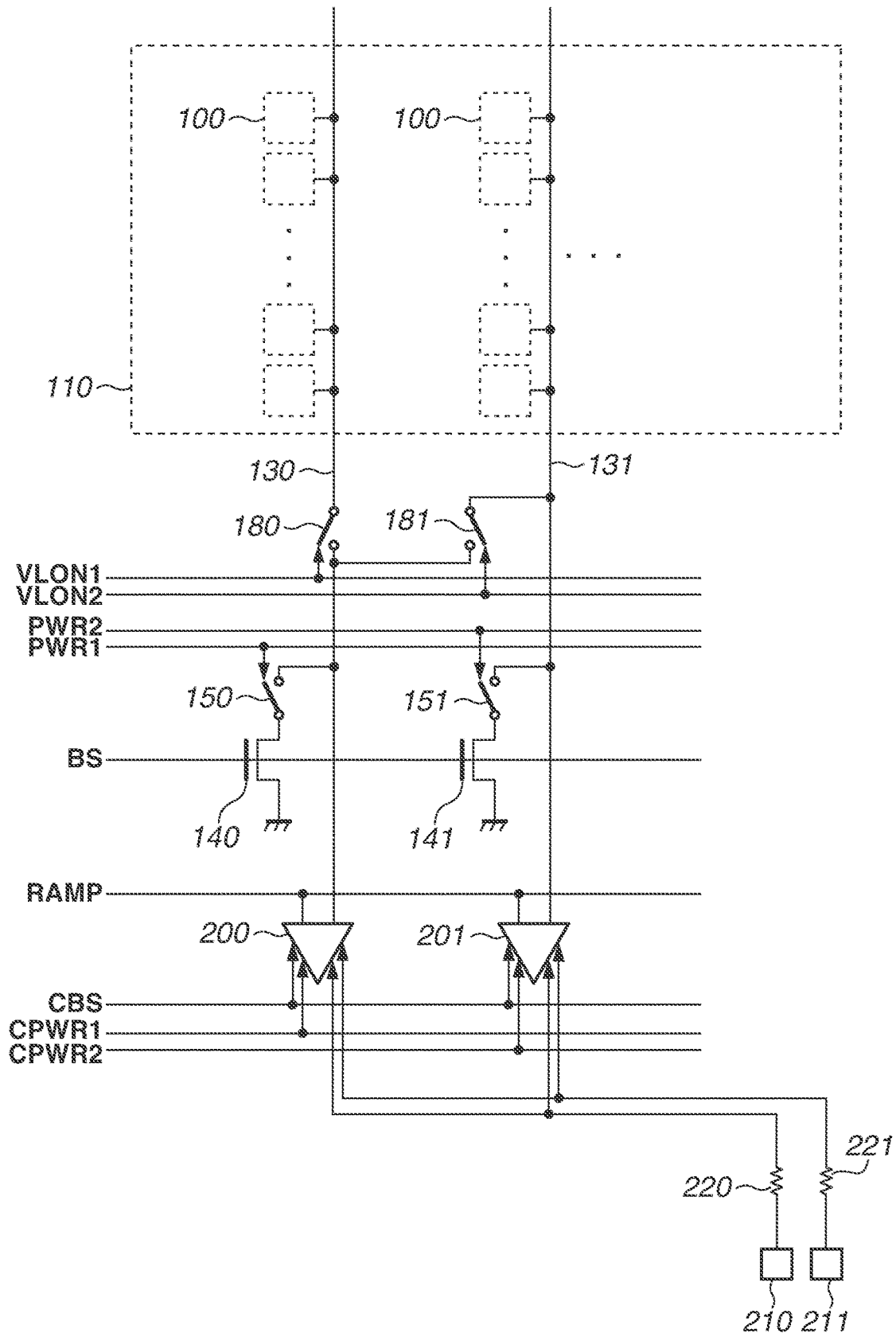
FIG. 7 is a schematic diagram illustrating a photoelectric conversion apparatus according to a third exemplary embodiment.

FIG. 7 schematically illustrates a photoelectric conversion apparatus according to a third exemplary embodiment.

Similarly to the second exemplary embodiment, the photoelectric conversion apparatus according to the present exemplary embodiment uses and switches between the high-speed mode with the normal SN ratio and the high SN mode with the low speed and the high SN ratio. Differences from the second exemplary embodiment will be mainly described.

The photoelectric conversion apparatus according to the present exemplary embodiment illustrated in FIG. 7 includes a comparator 200 as a signal processing circuit at the subsequent stage of the vertical output line 130, and a comparator 201 as a signal processing circuit at the subsequent stage of the vertical output line 131. The photoelectric conversion apparatus also includes a GND pad 210 and a resistor 220 that are connected to the comparators 200 and 201, and a GND pad 211 and a resistor 221 that are connected to the comparators 200 and 201. The photoelectric conversion apparatus further includes a ramp signal line RAMP, a bias signal line CBS, a control line CPWR1, and a control line CPWR2.

The photoelectric conversion apparatus illustrated in FIG. 7 can suppress not only the variation of the power supply voltage of the wiring, but also variations of power supply voltages and GND voltages of the comparators 200 and 201. Respective bias current values of the comparators 200 and 201 are driven by the bias voltage supplied from the bias signal line CBS. A ramp signal, serving as a reference signal, supplied from the ramp signal line RAMP is input to the input terminals. Currents flowing through the vertical output lines 130 and 131 are controlled by the control signal lines PWR1 and PWR2, respectively.

Figure 8:
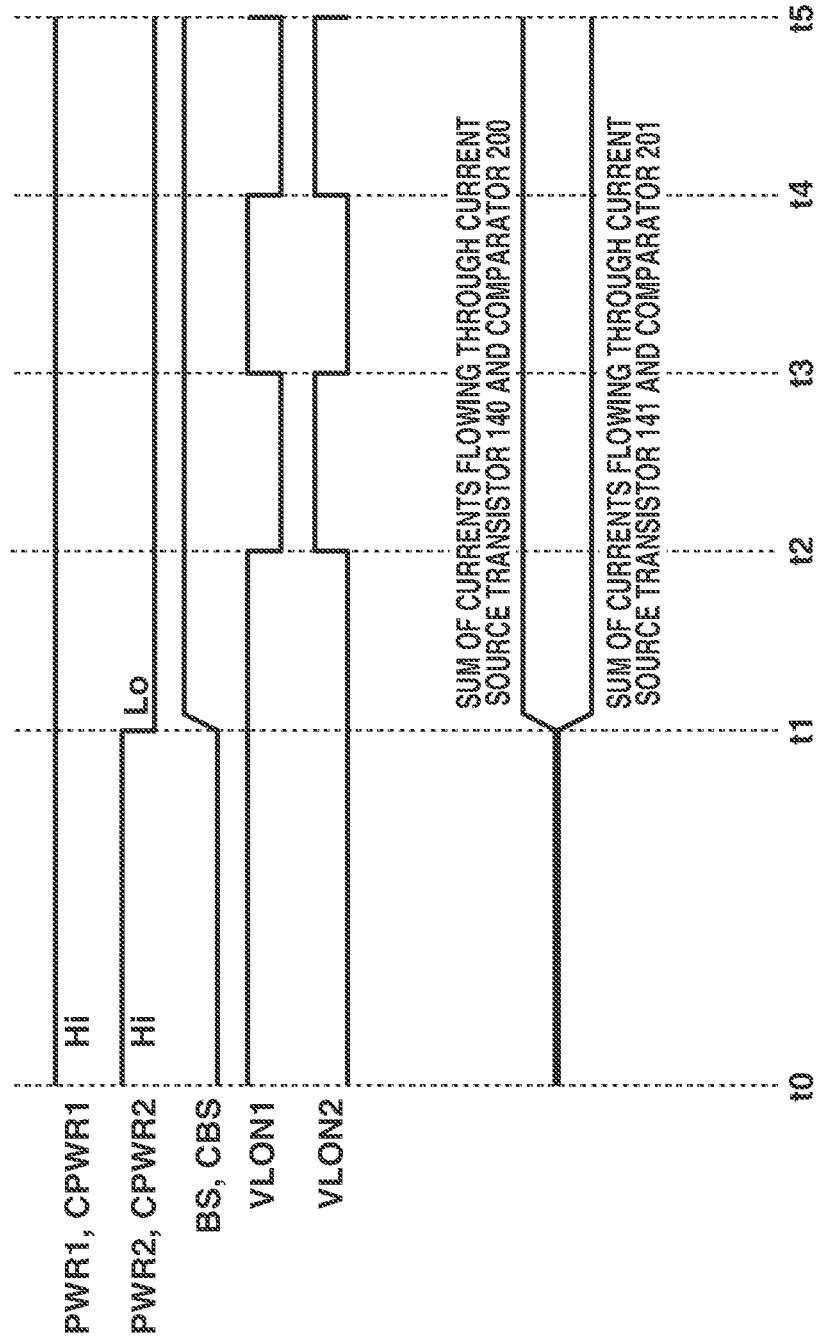
FIG. 8 is a timing diagram according to the third exemplary embodiment.

FIG. 8 illustrates a timing diagram as an operation example. The timing diagram illustrated in FIG. 8 is similar to the timing diagram illustrated in FIG. 6, except that control operations for the control line CPWR1, the control line CPWR2, and the bias signal line CBS are performed similarly to control operations for the control signal line PWR1, the control signal line PWR2, and the bias line BS, respectively.

During a period from a time t0 to a time t1, the control lines CPWR1 and CPWR2 are both at the high level and the comparators 200 and 201 perform processing on the signals output through the vertical output lines 130 and 131, respectively.

At the time t1, when the readout mode is shifted from the high-speed mode to the high SN mode and the bias voltage to be supplied from the bias signal line CBS is increased, the control line CPWR2 is set to the low level to stop the supply of current to the comparator 201. As a result, it is possible to suppress the variation of the total amount of currents flowing through the comparators 200 and 201 and to suppress the variation of the power supply voltage and the variation of the GND voltage. Each of the comparators 200 and 201 includes a differential stage and an amplification stage. Each of the differential stage and the amplification stage includes a current source. When the readout mode is shifted, the amount of current to be supplied to the differential stage may be changed or the amount of current to be supplied to the amplification stage may be changed.

During the period between the time t1 to a time t2, the comparator 200 is used to compare the signal output from the vertical output line 130 with the ramp signal, so that analog-to-digital (AD) conversion is performed.

During the period from the time t2 to a time t3, the comparator 201 is used to compare the signal output from the vertical output line 131 with the ramp signal, so that AD conversion is performed.

An operation in which the comparator 200 is used to perform the AD conversion of the signal from the vertical output line 130 will be described as an example with reference to a timing diagram illustrated in FIG. 9. The times t0 to t5 illustrated in FIG. 8 are independent of times t0 to t8 illustrated in FIG. 9.

During a period from a time t0 to a time t1, the control signal RES illustrated in FIG. 3 is set to a high level and the reset transistor 455 is turned on, so that the floating diffusion 420 is reset. Accordingly, the potential of the vertical output line 130 is set to a reset level.

At a time t2, a slope operation for changing the potential of the ramp signal with a lapse of time is started. Although FIG. 9 illustrates a case where the potential uniformly decreases, the ramp signal may have a potential that continuously increases with a lapse of time, or may have a potential that changes in a saw-tooth shape.

At a time t3, a magnitude relationship between the ramp signal input to the comparator 200 and the output signal from the vertical output line 130 is reversed and the output from the comparator 200 is reversed. The time for the output from the comparator 200 to be reversed is measured by a counter (not illustrated), so that the AD conversion of the reset level is performed.

At a time t4, the ramp signal is reset.

During a period from a time t5 to a time t6, the control signal TX illustrated in FIG. 3 is set to a high level and the transfer transistor 410 is turned on, so that photocharge is transferred from the photodiode 400 to the floating diffusion 420. The potential of the floating diffusion 420 decreases based on the amount of photocharge. Accordingly, the potential of the vertical output line 130 is set to the signal level.

At a time t7, the slop operation for the ramp signal is started again.

At a time t8, the magnitude relationship between the ramp signal input to the comparator 200 and the output from the vertical output line 130 is reversed again, and the output from the comparator 200 changes. The time for the output from the comparator 200 to change is measured by the counter (not illustrated), so that the AD conversion of the signal level is performed. Then, in a subsequent-stage processing circuit, correlated double sampling (CDS) processing is performed by obtaining the difference in AD conversion result between the reset level and the signal level.

The above-described operation is performed during the period from the time t1 to the time t2 illustrated in FIG. 8, so that the AD conversion of the signal from the vertical output line 130 is performed. Similarly, during the period from the time t2 to the time t3 illustrated in FIG. 8, the AD conversion of the signal from the vertical output line 131 is performed. Thereafter, the operation is repeated.

As described above, in the present exemplary embodiment, it is possible to suppress the variations of the power supply voltages and the GND voltages of the comparators 200 and 201 due to the switching of the readout mode.

In order to prevent the variation of the total amount of current, in one embodiment, the value of the amount of increase in the current flowing through the current source transistor 140 is set to be as close as possible to the value of the amount of decrease in the current flowing through the current source transistor 141. However, a balance between the amount of increase in the current and the amount of decrease in the current can be determined depending on an allowable image quality. For example, it is possible to employ a photoelectric conversion apparatus having a mode of causing a current to flow to all comparators, and a mode of causing a decreased amount of current or no current to flow to one-third of the comparators and causing an increased amount of current to flow to the other comparators, i.e., two-thirds of the comparators. In other words, the balance between the amount of increase in current and the amount of decrease in current may be maintained between a current source group including the current source transistor 140 and a current source group including the current source transistor 141.

Figure 9:
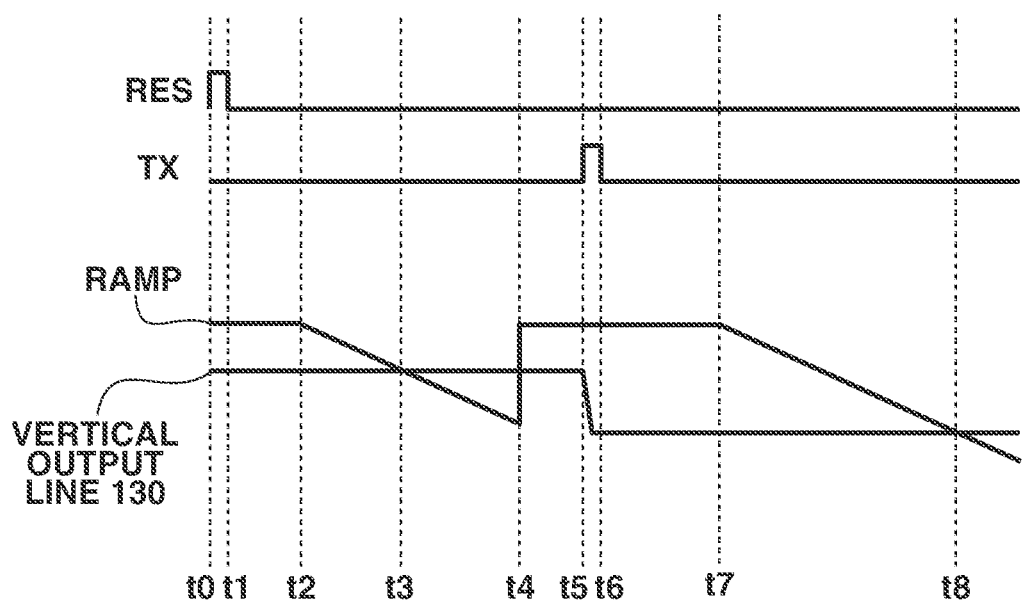
FIG. 9 is another timing diagram according to the third exemplary embodiment.

In the example illustrated in FIG. 9, it is possible to switch an AD conversion gain (V/LSB) by changing the slope of the ramp signal. When the readout mode is shifted to the high SN mode at the time t1 in FIG. 8, the AD conversion gain may also be switched at the same time, or the AD conversion may be performed without switching of the AD conversion gain.

While the example where the bias line BS is common to the gates of the current source transistors 140 and 141 and the control lines (the control signal lines PWR1 and PWR2) are provided for the switches 150 and 151, respectively, so that one of the current source transistors 140 and 141 is brought into the power saving state has been described with reference to FIG. 7, the configuration is not limited thereto. Bias lines may be separately provided for the respective gates of the current source transistors 140 and 141, and one of the current source transistors 140 and 141 may be brought into the power saving state. In this case, for example, a state of causing a small current of about 0.1 µA to flow without interrupting the supply of current may be set as the power saving state. By causing a smaller current to flow in the power saving mode, it is possible to shorten the time for returning from the power saving mode.

Figure 10:
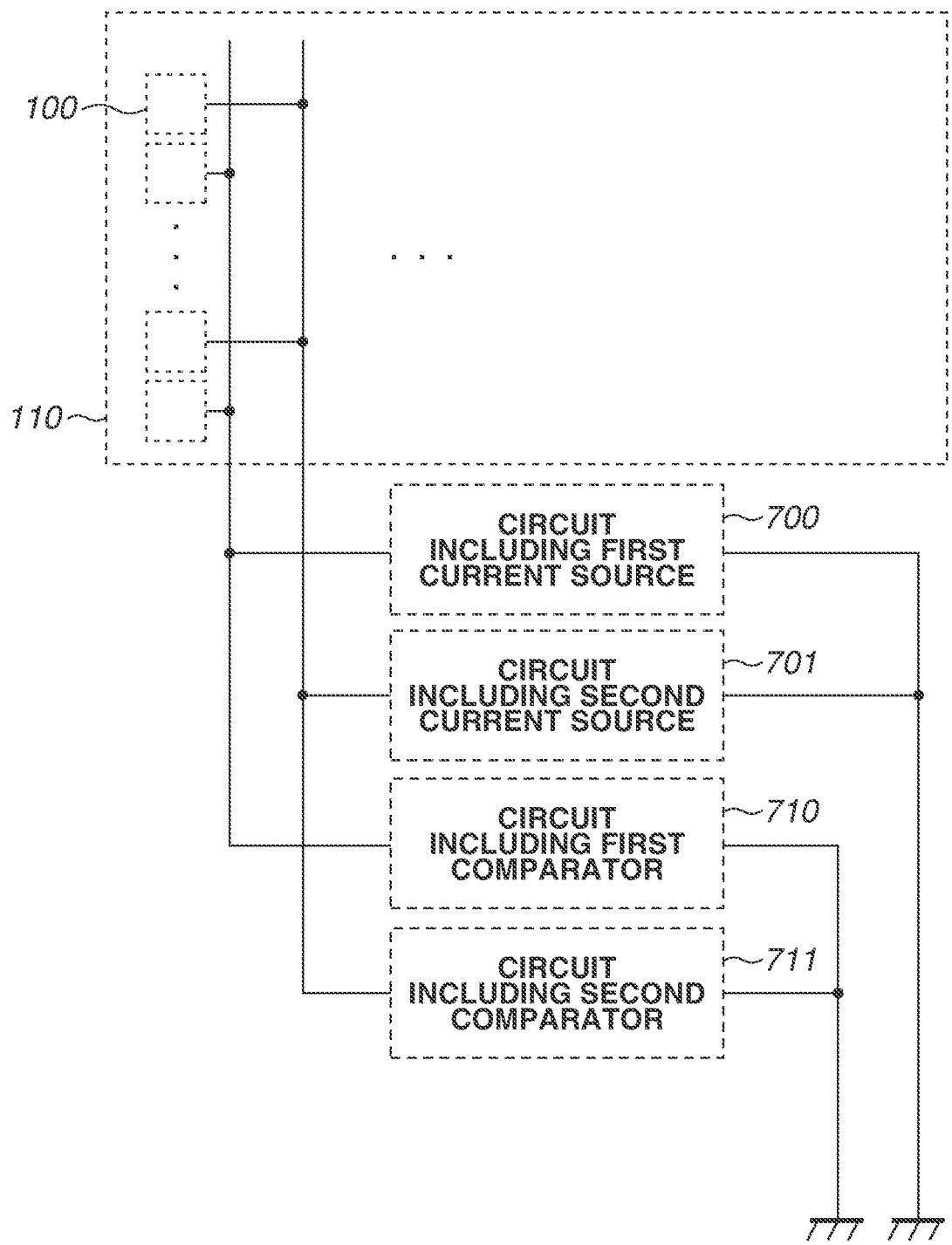
FIG. 10 is a schematic diagram illustrating a photoelectric conversion apparatus according to a fourth exemplary embodiment.
Figure 11:
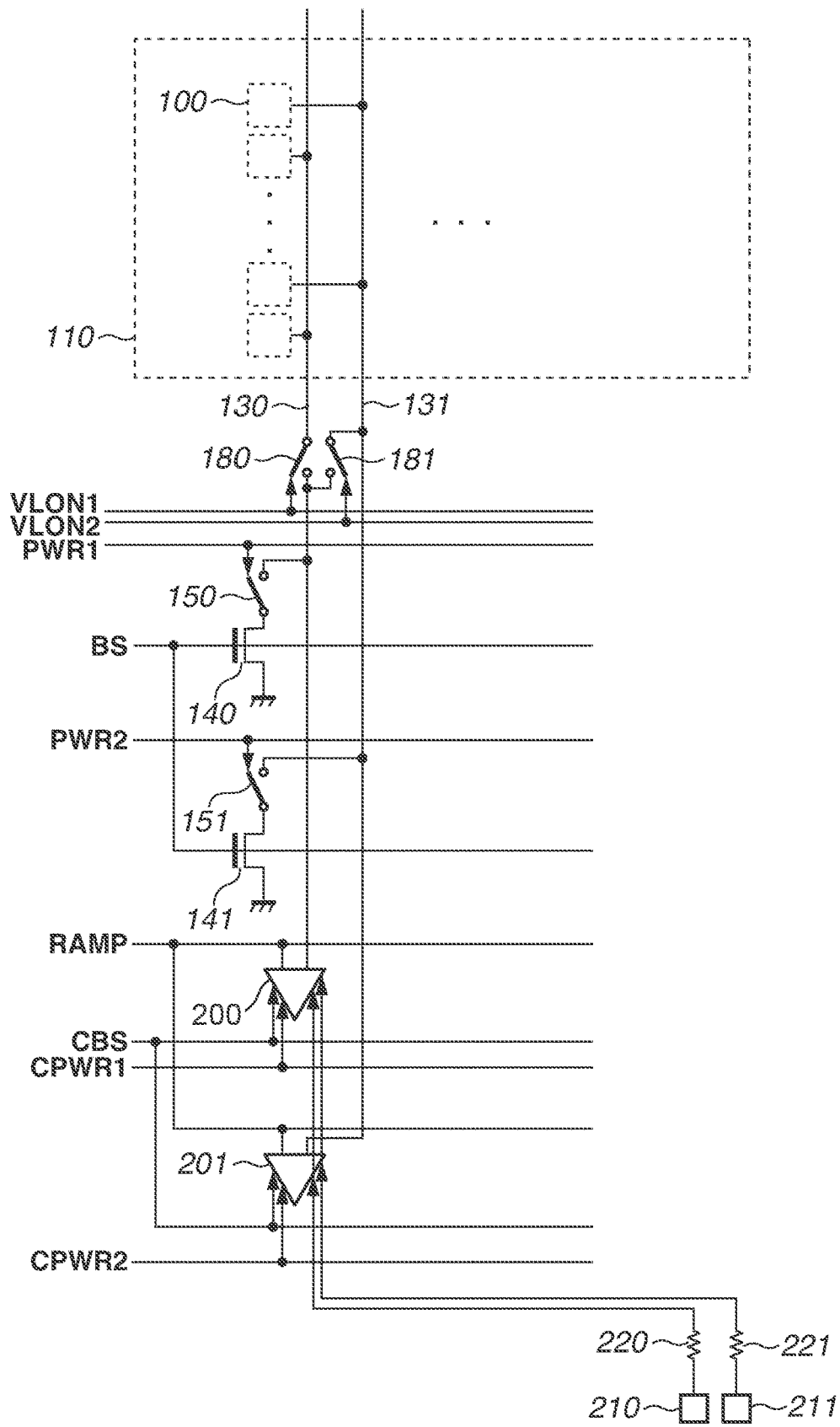
FIG. 11 is another schematic diagram illustrating the photoelectric conversion apparatus according to the fourth exemplary embodiment.

FIGS. 10 and 11 each schematically illustrate a photoelectric conversion apparatus according to a fourth exemplary embodiment. Differences from the third exemplary embodiment will be mainly described.

FIG. 10 is a block diagram illustrating the photoelectric conversion apparatus according to the present exemplary embodiment. The photoelectric conversion apparatus includes a circuit 700 including a first current source, a circuit 701 including a second current source, a circuit 710 including a first comparator, and a circuit 711 including a second comparator. FIG. 11 illustrates specific examples of the circuits 700 to 711 in the photoelectric conversion apparatus illustrated in FIG. 10. In the photoelectric conversion apparatus illustrated in FIG. 11, signals in different pixel rows in the same pixel column can be read out in parallel via the vertical output lines 130 and 131. In other words, a high-speed readout operation (for reading signals in a plurality of rows simultaneously) can be performed.

In the third exemplary embodiment, as illustrated in the timing diagram of FIG. 8, during the period from the time t0 to the time t1, the pixel signals are read out row by row. In the high SN mode at and after the time t1, pixel signals corresponding to the odd columns and pixel signals corresponding to the even columns are alternately read out.

In the photoelectric conversion apparatus illustrated in FIG. 11, an operation for reading out pixel signals two rows by two rows in parallel is performed during the period from the time t0 to the time t1, and an operation for reading out pixel signals row by row is performed in the high SN mode at and after the time t1, according to a timing diagram similar to that of FIG. 8. Also in this case, it is possible to suppress the variation of the power supply voltage when the readout mode is shifted at the time t1.

As illustrated in FIG. 10, the circuit 700 including the first current source and the circuit 701 including the second current source are arranged close to each other, and the circuit 710 including the first comparator and the circuit 711 including the second comparator are also arranged close to each other.

In the circuit diagram of FIG. 11 in which the circuits 700 to 711 illustrated in FIG. 10 are arranged, the current source transistors 140 and 141 are arranged adjacent to each other and the comparators 200 and 201 are arranged adjacent to each other. In other words, the circuit 701 is disposed between the circuit 700 and the circuit 710, and the circuit 710 is disposed between the circuit 701 and the circuit 711. Although the current source transistor 140, the comparator 200, the current source transistor 141, and the comparator 201 may be arranged in this order from the pixel side toward the GND pad 211 side, in one embodiment, the same circuit elements are arranged to be adjacent to each other as illustrated in FIG. 11. In such an arrangement, the common impedances from the comparator 200 and the comparator 201 to the GND pad 210 and the GND pad 211 are set to be substantially equal, so that the effect of suppressing the variation of the power supply voltage and the variation of the GND voltage can be enhanced.

Figure 12:
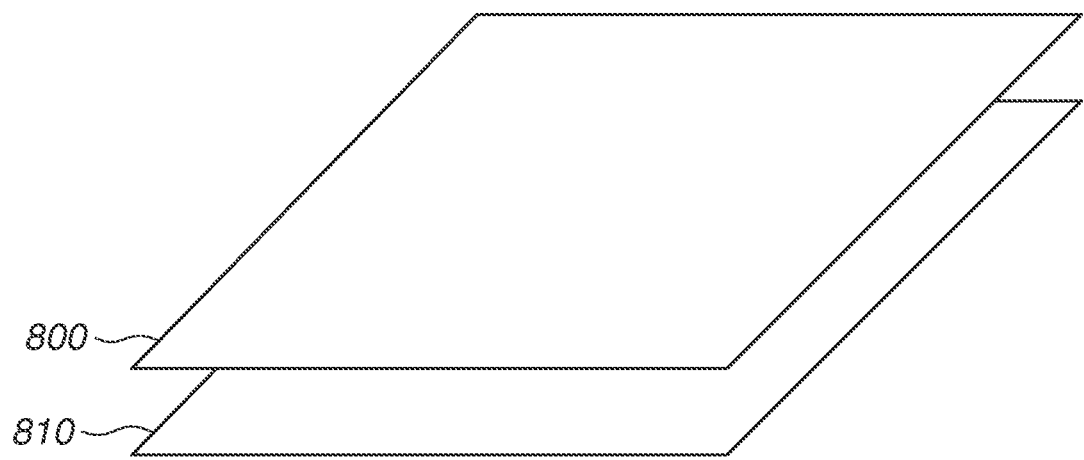
FIG. 12 is a diagram illustrating a photoelectric conversion apparatus according to a modified example of the fourth exemplary embodiment.

The photoelectric conversion apparatuses according to each of the exemplary embodiments may have a laminated structure as illustrated in FIG. 12.

The photoelectric conversion apparatus having the laminated structure illustrated in FIG. 12 includes a pixel substrate 800 and a circuit substrate 810. Assume a case where the current source transistors 140 and 141 and the comparators 200 and 201 are arranged on the circuit substrate 810.

In a case where a unit current flowing through the current source transistor 140, the current source transistor 141, the comparator 200, and the comparator 201 is increased when the readout mode is shifted, it is possible to suppress the variation of current by decreasing the number of circuits to be operated and to suppress the amount of heat generation and an increase in the nonuniformity of the amount of heat generation.

Accordingly, in each of the pixels 100 in the pixel substrate 800, it is possible to suppress an increase in dark current flowing through the photodiode 400 and suppress deterioration in image quality due to the nonuniformity of the amount of heat generation. Furthermore, it is possible to suppress the variation of current between adjacent circuits, thereby enhancing the effect of suppressing the nonuniformity of the amount of heat generation.

For example, a mode in which the level of current flowing through the comparators 200 and 201 is low may be set as a moving image mode, and a mode in which the level of current flowing through the comparators 200 and 201 is high may be set as a still image mode.

Figure 13:
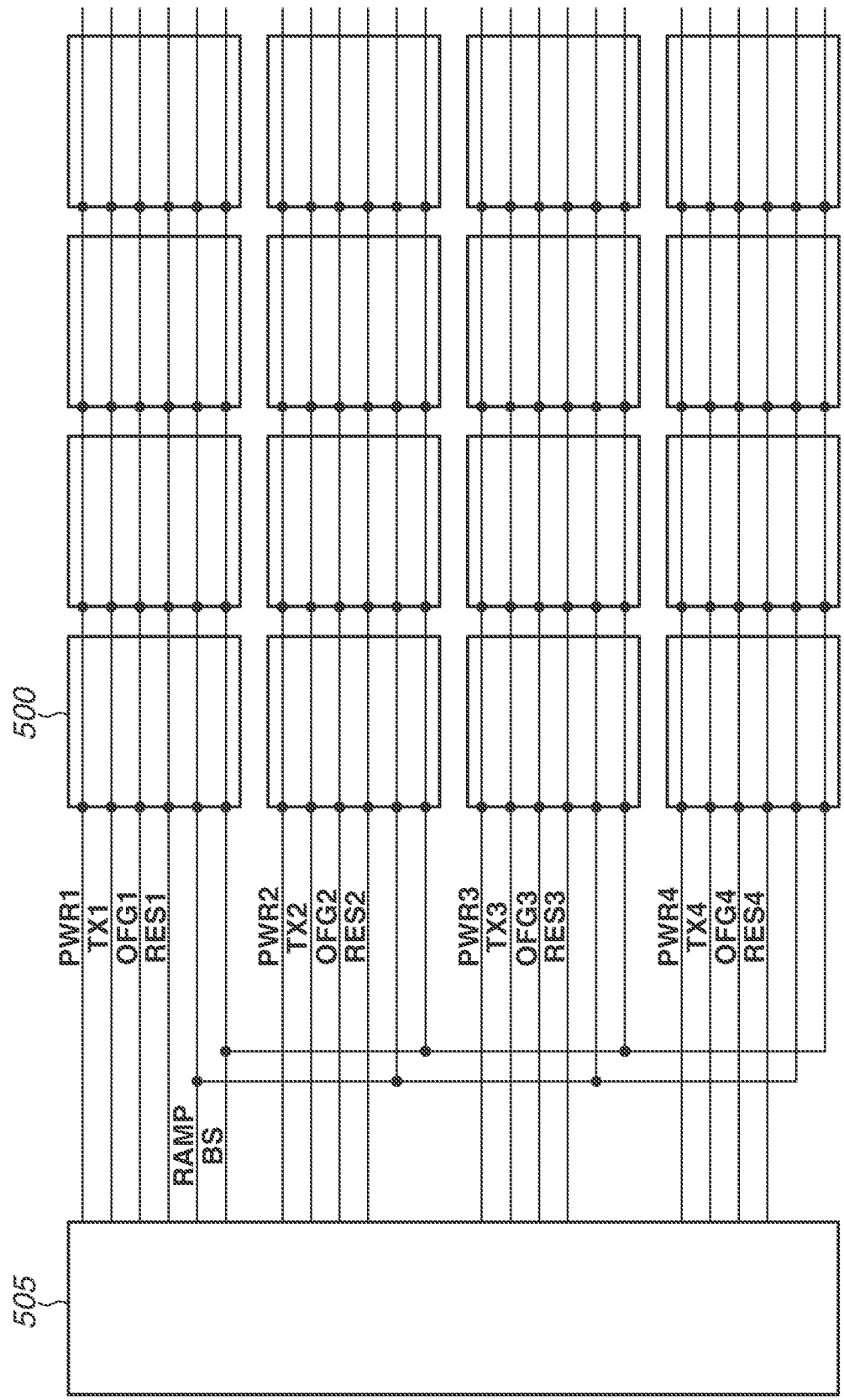
FIG. 13 is a schematic diagram illustrating a photoelectric conversion apparatus according to a fifth exemplary embodiment.
Figure 14:
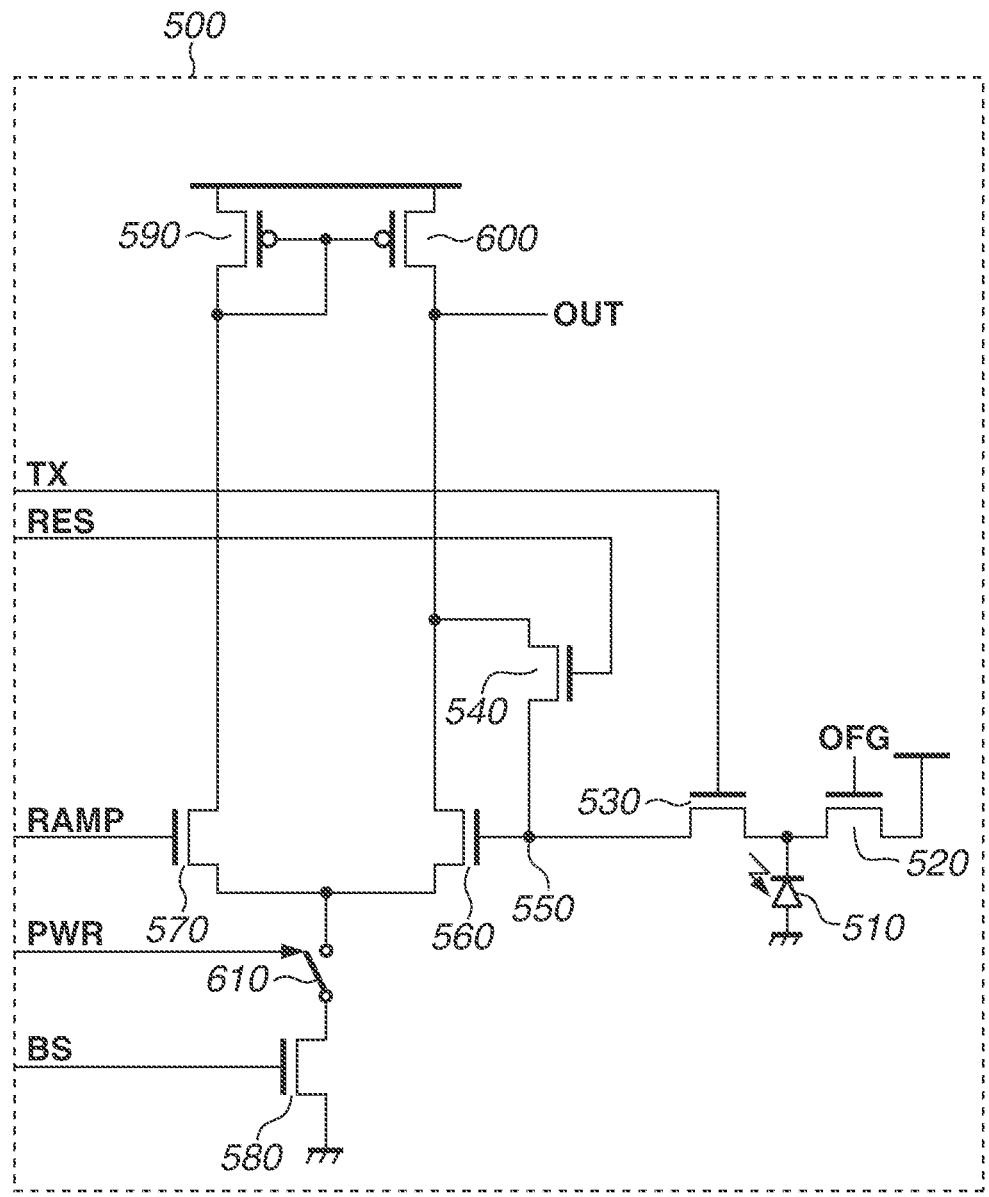
FIG. 14 is another schematic diagram illustrating the photoelectric conversion apparatus according to the fifth exemplary embodiment.

FIGS. 13 and 14 each schematically illustrate a photoelectric conversion apparatus and a comparator according to a fifth exemplary embodiment.

The photoelectric conversion apparatus according to the present exemplary embodiment uses, as readout modes, a global shutter mode for reading out signals using a global shutter and a rolling shutter mode for reading out signals using a rolling shutter, and switches between these modes.

As illustrated in FIGS. 13 and 14, a unit (hereinafter also referred to as a pixel AD) 500 includes a pixel and a comparator and has a configuration in which each pixel includes a single comparator. FIG. 13 also illustrates a control circuit 505.

The pixel AD 500 illustrated in FIG. 14 includes a photodiode 510, an overflow transistor 520, a transfer transistor 530, a reset transistor 540, and a floating diffusion 550. A transistor 560 and a transistor 570 form a differential pair. A transistor 580 operates as a current source. A transistor 590 and a transistor 600 form a current mirror. The pixel AD 500 also includes a switch 610.

A global shutter operation will be described with reference to FIG. 15.

Figure 15:
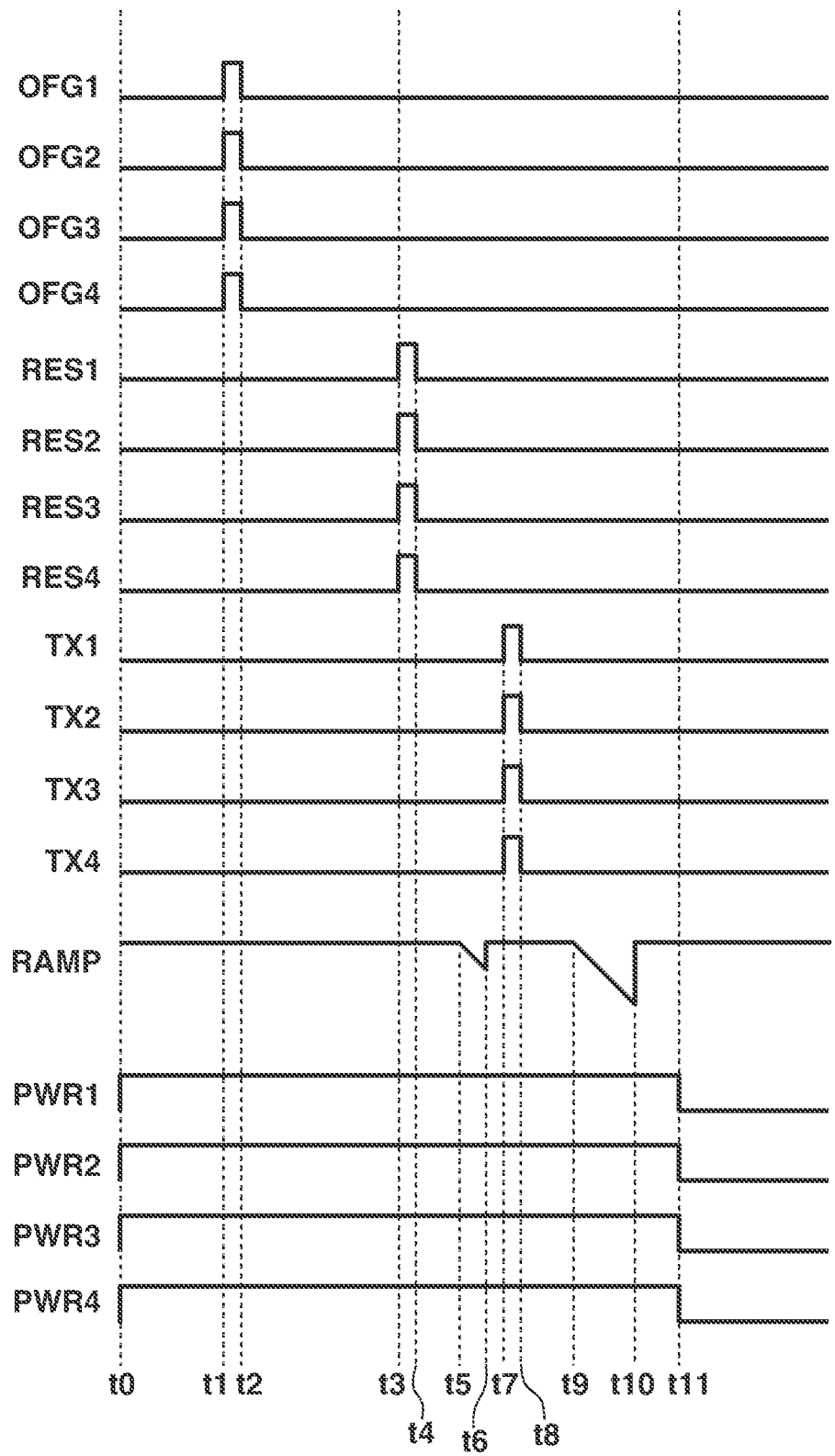
FIG. 15 is a timing diagram according to the fifth exemplary embodiment.

Referring to FIG. 15, a control signal OFG1 is a control signal OFG corresponding to the pixel ADs 500 disposed in a first row in FIG. 13, and control signals OFG2, OFG3, and OFG4 correspond to those disposed in a second row, a third row, and a fourth row in FIG. 13, respectively. Similarly, a control signal RES1 is the control signal RES corresponding to the pixel ADs 500 disposed in the first row in FIG. 13, a control signal TX1 is the control signal TX corresponding to the pixel ADs 500 disposed in the first row in FIG. 13, and the control signal PWR1 is a control signal PWR corresponding to the pixel ADs 500 disposed in the first row in FIG. 13.

During a period from a time t1 to a time t2, the control signals OFG1 to OFG4 are set to a high level, so that the overflow transistor 520 is turned on and the electric charge in the photodiode 510 is reset in all the pixel ADs 500 illustrated in FIG. 13.

During a period from a time t3 to a time t4, control signals RES1 to RES4 are set to a high level, so that the reset transistor 540 is turned on and the floating diffusion 550 is reset in all the pixel ADs 500 illustrated in FIG. 13.

During a period from a time t5 to a time t6, the AD conversion of the reset level of the floating diffusion 550 is performed by performing the slope operation for the ramp signal.

During a period from a time t7 to a time t8, control signals TX1 to TX4 are set to a high level, so that the photocharge is transferred from the photodiode 510 to the floating diffusion 550. A charge accumulation period corresponds to a period from the time t2 to the time t8 in the pixels in all rows. The potential of the floating diffusion 550 decreases to the signal level based on the amount of photocharge.

During a period from a time t9 to a time t10, the AD conversion of the signal level of the floating diffusion 550 is performed by performing the slope operation for the ramp signal again.

During a period from the time t0 to a time t11, all the control signals PWR1 to PWR4 are at the high level and all the pixel ADs 500 are in an operating state. The control signals PWR1 to PWR4 are set to the high level at the time t0 earlier than the time t3 at which the readout operation is started. This is because a predetermined time is taken to converge the variation of the power supply voltage due to the variation of current.

Next, a rolling shutter operation will be described with reference to FIG. 16.

Similarly to FIG. 15, the control signal OFG1 is the control signal OFG corresponding to the pixel ADs 500 disposed in the first row in FIG. 13, and the control signals OFG2, OFG3, and OFG4 correspond to those disposed in the second row, the third row, and the fourth row in FIG. 13, respectively. Similarly, the control signal RES1 is the control signal RES corresponding to the pixel ADs 500 disposed in the first row in FIG. 13, the control signal TX1 is the control signal TX corresponding to the pixel ADs 500 disposed in the first row in FIG. 13, and the control signal PWR1 is the control signal PWR corresponding to the pixel ADs 500 disposed in the first row in FIG. 13.

As described above, in the example of FIG. 15, the global shutter operation in which the pixel ADs 500 in all rows accumulate electric charge at the same timing is performed.

During a period from a time t0 to a time t1, the control signal OFG1 is set to the high level, so that the overflow transistor 520 is turned on and the electric charge in the photodiode 510 is reset in the pixel ADs 500 disposed in the first row in FIG. 13.

During a period from a time t2 to a time t3, the control signal OFG2 is set to the high level, so that the overflow transistor 520 is turned on and the electric charge in the photodiode 510 is reset in the pixel ADs 500 disposed in the second row in FIG. 13.

During a period from a time t4 to a time t5, the control signal OFG3 is set to the high level, so that the overflow transistor 520 is turned on and the electric charge in the photodiode 510 is reset in the pixel ADs 500 disposed in the third row in FIG. 13.

During a period from a time t7 to a time t8, the control signal OFG4 is set to the high level, so that the overflow transistor 520 is turned on and the electric charge in the photodiode 510 is reset in the pixel ADs 500 disposed in the fourth row in FIG. 13.

During a period from a time t9 to a time t10, the control signal RES1 is set to the high level, so that the reset transistor 540 is turned on and the floating diffusion 550 is reset in the pixel ADs 500 disposed in the first row in FIG. 13.

During a period from a time t11 to a time t12, the AD conversion of the reset level of the floating diffusion 550 is performed by performing the slope operation for the ramp signal. At this time, the control signal PWR1 is at the high level and the control signals PWR2 to PWR4 are at the low level. In the pixel ADs 500 disposed in the first row in FIG. 13 the switch 610 is turned on to allow a current to flow and the AD conversion is ready to be performed. The control signal PWR1 is set to the high level at a time t6 earlier than the time t9 at which the readout operation is started. This is because a predetermined time is taken to converge the variation of the power supply voltage due to the variation of current.

During a period from a times t13 to a time t14, the control signal TX1 is set to the high level, so that the photocharge is transferred from the photodiode 510 to the floating diffusion 550. At this time, the charge accumulation period for the pixel ADs 500 disposed in the first row in FIG. 13 corresponds to the period from the time t1 to the time t14.

During a period from a time t15 to a time t16, the AD conversion of the signal level of the floating diffusion 550 is performed by performing the slope operation for the ramp signal.

Similarly, during a period from a time t17 to a time t19, the AD conversion of the reset level and the signal level is performed in the pixel ADs 500 disposed in the second row in FIG. 13. The charge accumulation period corresponds to a period from the time t3 to a time t18.

Similarly, in the pixel ADs 500 disposed in the third row in FIG. 13, the charge accumulation period corresponds to a period from the time t5 to a time t20, and in the pixel ADs 500 disposed in the fourth row in FIG. 13, the charge accumulation period corresponds to a period from the time t8 to a time t22.

As described above, in the example of FIG. 16, the rolling shutter operation in which the pixel ADs 500 in different rows accumulate electric charge at different timings is performed.

At the time t17 in the rolling shutter mode, the control signal PWR1 is set to the low level and the control signal PWR2 is set to the high level, so that it is possible to maintain the current consumption and suppress the variation of the power supply voltage. Also, at the time t19 and a time t21, the same operation is performed.

Figure 16:
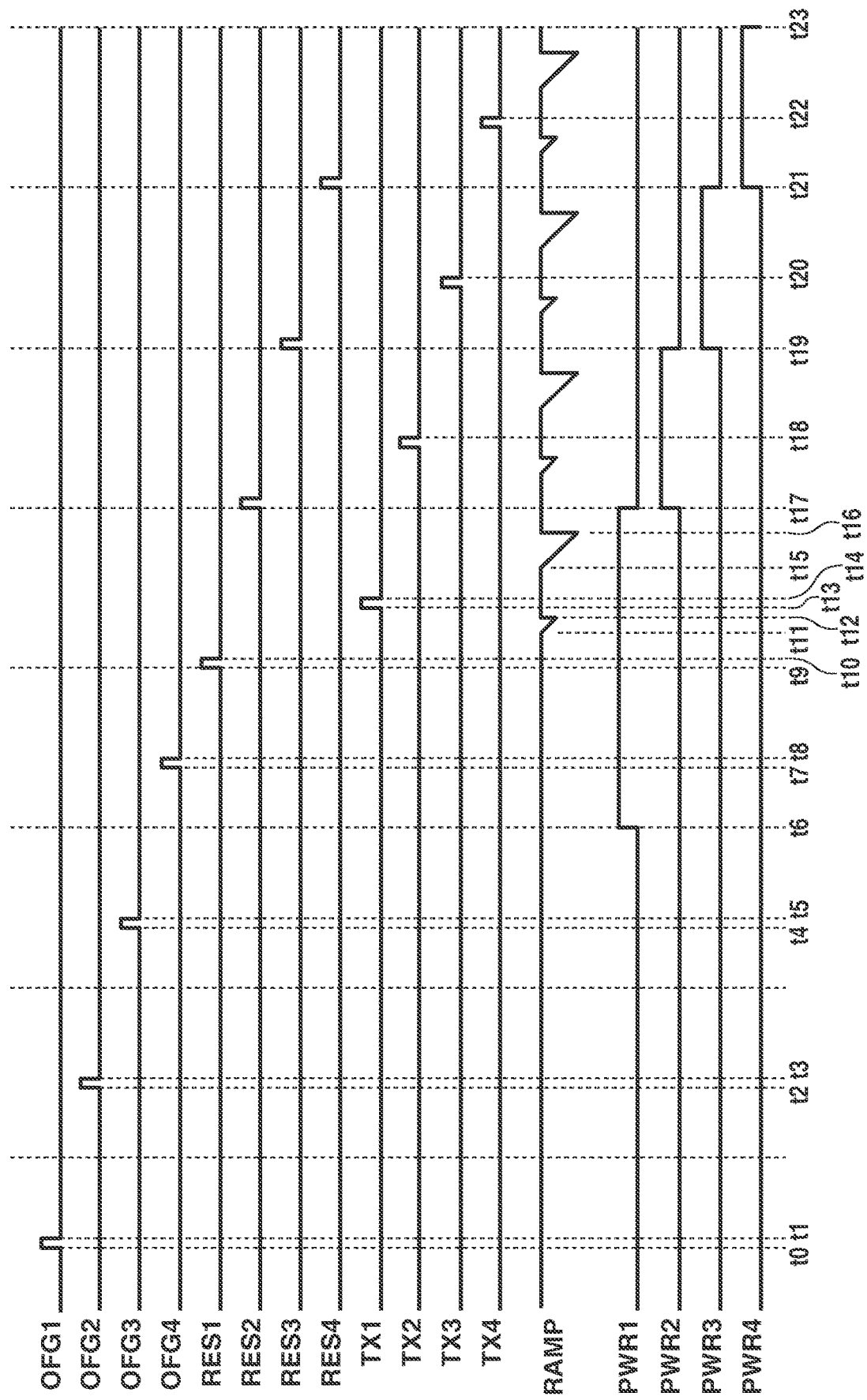
FIG. 16 is another timing diagram according to the fifth exemplary embodiment.

Here, assume a case where the readout mode is shifted from the rolling shutter mode for performing the rolling shutter operation illustrated in FIG. 16 to the global shutter mode for performing the global shutter operation illustrated in FIG. 15.

At a time t23 in FIG. 16, the control signal PWR4 is set to the high level and the control signals PWR1 to PWR3 are set to the low level. On the other hand, at the time t0 in FIG. 15, all the control signals PWR1 to PWR4 are set to the high level. At the timing when the readout mode is shifted, the bias voltage to be supplied from the bias line BS to the transistor 580 is decreased and the current consumption per the pixel AD 500 is decreased, so that it is possible to maintain the total amount of current at a substantially constant level and to suppress the variation of the power supply voltage in shifting the readout mode.

While in the present exemplary embodiment, the case where the readout mode is shifted from the rolling shutter mode for reading out signals sequentially row by row to the global shutter mode has been described as an example, the readout operation is not limited thereto. For example, the readout operation may be shifted from a mode for reading out signals sequentially column by column to the global shutter operation. Alternatively, the readout operation may be shifted from the global shutter operation in which the pixel ADs 500 to be operated are thinned out to the global shutter operation in which the pixel ADs 500 to be operated are not thinned out.

While in the present exemplary embodiment, the case where each of the pixel ADs 500 has the configuration in which a comparator is provided for each pixel has been described as an example, the present exemplary embodiment can also be applied to a block AD in which a comparator is provided for a plurality of pixels (a pixel block) arranged in an array.

Figure 17:
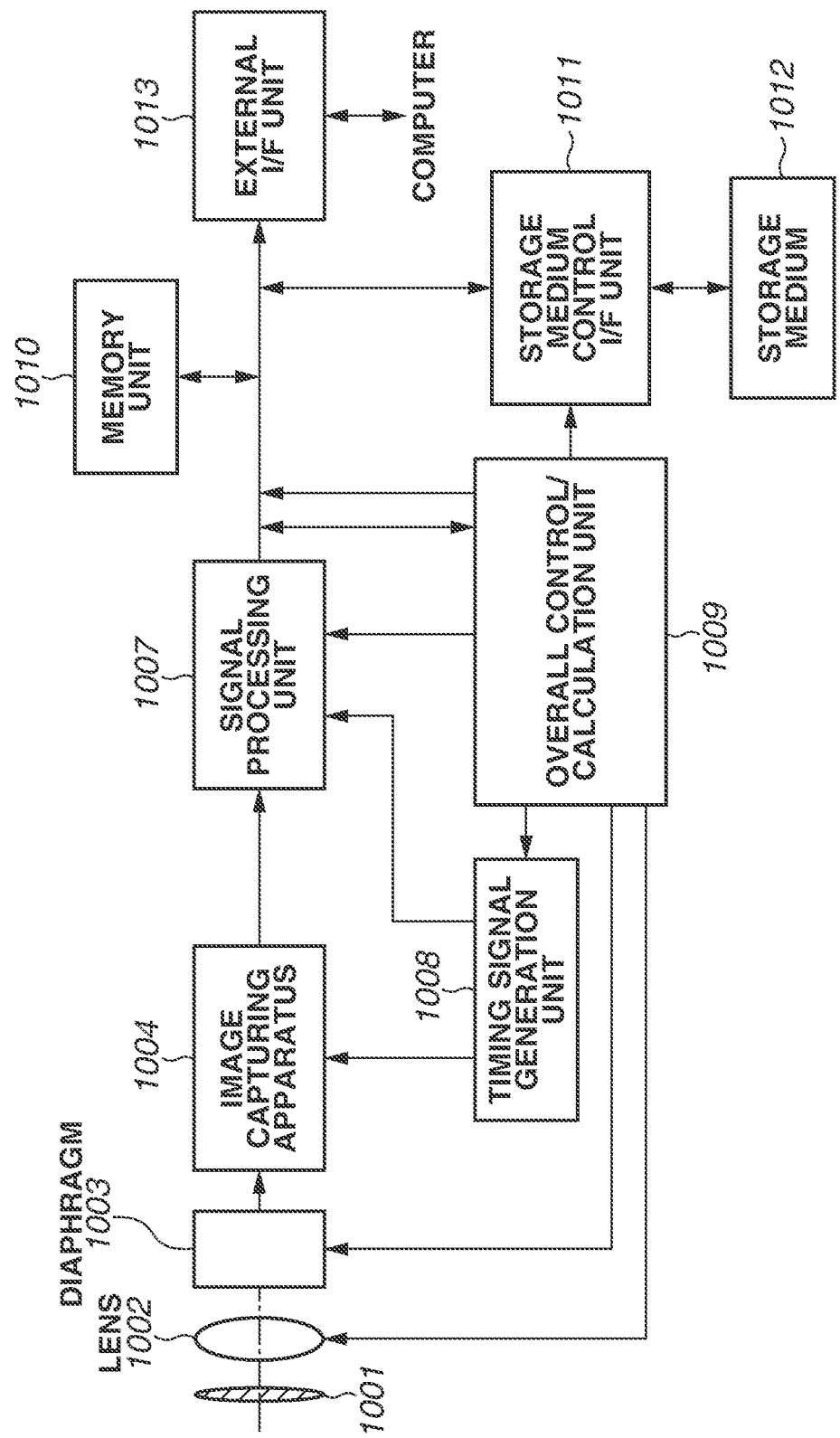
FIG. 17 is a block diagram illustrating a configuration of a photoelectric conversion system according to a sixth exemplary embodiment.

A photoelectric conversion system according to a sixth exemplary embodiment will be described with reference to FIG. 17. FIG. 17 is a block diagram illustrating a schematic configuration of the photoelectric conversion system according to the present exemplary embodiment.

The photoelectric conversion apparatuses according to the first to fifth exemplary embodiments can be applied to various photoelectric conversion systems. Examples of the applicable photoelectric conversion systems include a digital still camera, a digital camcorder, a monitoring camera, a copying machine, a facsimile, a mobile phone, an on-vehicle camera, and an observation satellite. Examples of the applicable photoelectric conversion systems also include a camera module including an optical system, such as a lens, and an image capturing apparatus. FIG. 17 is a block diagram illustrating a digital still camera as an example of the photoelectric conversion systems.

The photoelectric conversion system illustrated in FIG. 17 includes an image capturing apparatus 1004 as an example of the photoelectric conversion apparatus, and a lens 1002 that forms an optical image of a subject on the image capturing apparatus 1004. The photoelectric conversion system also includes a diaphragm 1003 for varying the amount of light that passes through the lens 1002, and a barrier 1001 for protecting the lens 1002. The lens 1002 and the diaphragm 1003 form an optical system for collecting light on the image capturing apparatus 1004. The image capturing apparatus 1004 is one of the photoelectric conversion apparatuses according to the above-described exemplary embodiments, and converts the optical image formed by the lens 1002 into an electric signal.

The photoelectric conversion system also includes a signal processing unit 1007 as an image generation unit that generates an image by performing processing on the signal output from the image capturing apparatus 1004. The signal processing unit 1007 performs an operation of outputting image data by performing various correction and compression processes as needed. The signal processing unit 1007 may be formed on a semiconductor substrate on which the image capturing apparatus 1004 is provided, or may be formed on a semiconductor substrate different from the semiconductor substrate on which the image capturing apparatus 1004 is provided.

The photoelectric conversion system further includes a memory unit 1010 for temporarily storing image data, and an external interface (I/F) unit 1013 for communicating with an external computer or the like. The photoelectric conversion system further includes a storage medium 1012, such as a semiconductor memory, for storing or reading out captured image data, and a storage medium control I/F unit 1011 for storing data in the storage medium 1012 or reading out data from the storage medium 1012. The storage medium 1012 may be incorporated in the photoelectric conversion system, or may be detachably mounted on the photoelectric conversion system.

The photoelectric conversion system further includes the overall control/calculation unit 1009 for controlling various calculations and the overall operation of the digital still camera, and a timing signal generation unit 1008 for outputting various timing signals to the image capturing apparatus 1004 and the signal processing unit 1007. In this example, the timing signals and the like may be input from an external apparatus, and the photoelectric conversion system may include at least the image capturing apparatus 1004 and the signal processing unit 1007 that processes the signal output from the image capturing apparatus 1004.

The image capturing apparatus 1004 outputs an imaging signal to the signal processing unit 1007. The signal processing unit 1007 performs predetermined signal processing on the imaging signal output from the image capturing apparatus 1004, and outputs image data. The photoelectric conversion system uses the image data to generate an image.

As described above, according to the present exemplary embodiment, the photoelectric conversion system to which the photoelectric conversion apparatus (the image capturing apparatus) according to any one of the above-described exemplary embodiments is applied can be achieved.

Figure 18A:
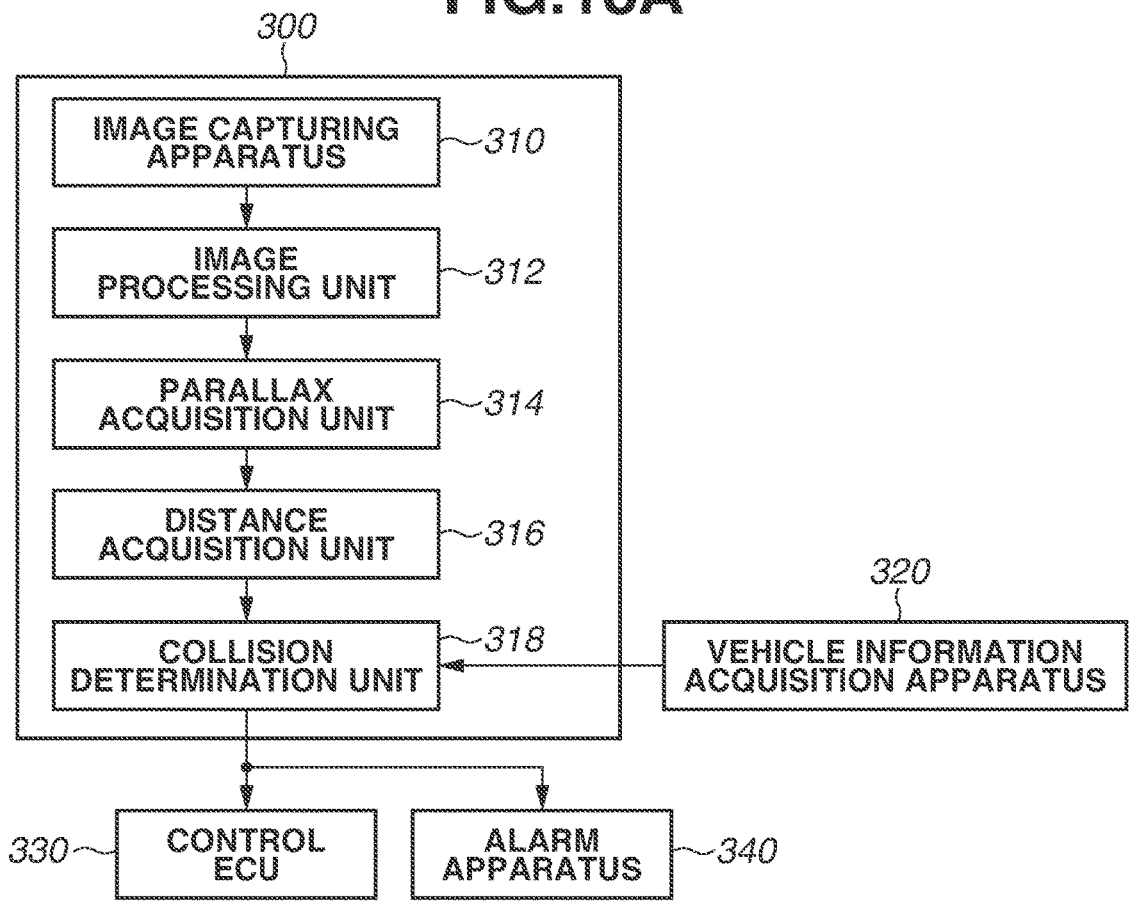
FIG. 18A is a block diagram illustrating a configuration of a photoelectric conversion system according to a seventh exemplary embodiment.
Figure 18B:
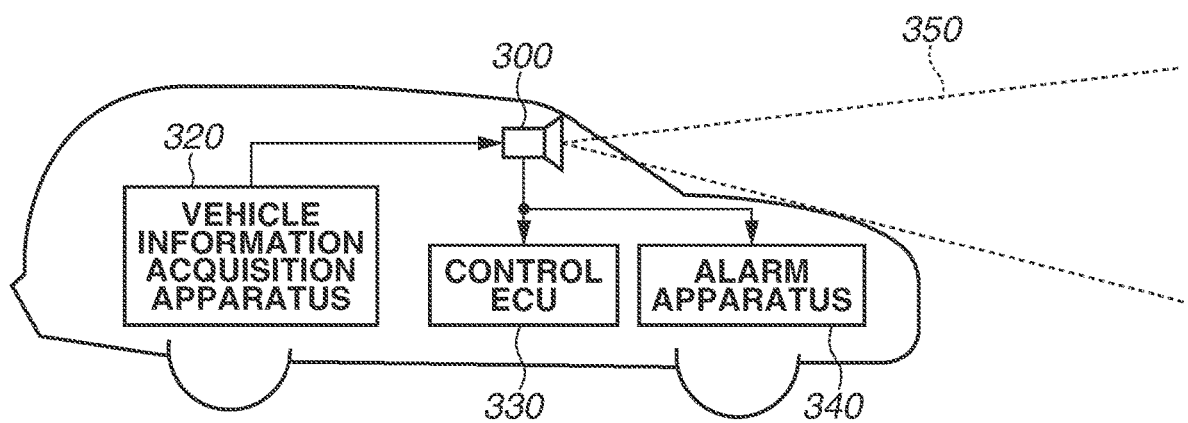
FIG. 18B is a diagram illustrating a configuration of a moving body according to the seventh exemplary embodiment.

A photoelectric conversion system and a moving body according to a seventh exemplary embodiment will be described with reference to FIGS. 18A and 18B. FIG. 18A is a block diagram illustrating a configuration of the photoelectric conversion system according to the present exemplary embodiment. FIG. 18B illustrates a configuration of the moving body according to the present exemplary embodiment.

FIG. 18A illustrates an example of a photoelectric conversion system 300 for an on-vehicle camera. The photoelectric conversion system 300 includes an image capturing apparatus 310. The image capturing apparatus 310 is an example of the photoelectric conversion apparatus (the image capturing apparatus) according to any one of the above-described exemplary embodiments. The photoelectric conversion system 300 also includes an image processing unit 312 that performs image processing on a plurality of pieces of image data acquired by the image capturing apparatus 310, and a parallax acquisition unit 314 that calculates a parallax (a phase difference between parallax images) based on a plurality of pieces of image data acquired by the photoelectric conversion system 300. The photoelectric conversion system 300 further includes a distance acquisition unit 316 that calculates a distance to an object based on the calculated parallax, and a collision determination unit 318 that determines the possibility of occurrence of a collision based on the calculated distance. In this example, the parallax acquisition unit 314 and the distance acquisition unit 316 are examples of a distance information acquisition unit that acquires distance information about a distance to an object. More specifically, the distance information is information about a parallax, a defocus amount, a distance to an object, and the like. The collision determination unit 318 may determine the possibility of occurrence of a collision by using any one of the pieces of distance information. The distance information acquisition unit may be implemented by specifically designed hardware, or may be implemented by a software module. The distance information acquisition unit may also be implemented by a field programmable gate array (FPGA), an application specific integrated circuit (ASIC), or the like, or a combination thereof.

The photoelectric conversion system 300 is connected to a vehicle information acquisition apparatus 320 and can obtain vehicle information such as a vehicle speed, a yaw rate, and a steering angle. The photoelectric conversion system 300 is also connected to a control ECU 330 serving as a control unit that outputs, based on the determination result from the collision determination unit 318, a control signal for producing a breaking force on a vehicle. The photoelectric conversion system 300 is also connected to an alarm apparatus 340 that issues an alarm to a driver based on the determination result from the collision determination unit 318. For example, if a collision is likely to occur based on the determination result from the collision determination unit 318, the control ECU 330 performs vehicle control for avoiding a collision or reducing damage by, for example, applying a brake, pushing back an accelerator, or suppressing an engine output. The alarm apparatus 340 issues an alarm to a user by, for example, issuing an alarm such as a sound, displaying alarm information on a screen of a car navigation system, or applying a vibration to a seat belt or a steering wheel.

In the present exemplary embodiment, the photoelectric conversion system 300 captures an image of the periphery of the vehicle, for example, the front or the back of the vehicle. FIG. 18B illustrates the photoelectric conversion system 300 in a case where an image of a front area (an imaging area 350) of the vehicle is captured. The vehicle information acquisition apparatus 320 transmits an instruction to the photoelectric conversion system 300 or the image capturing apparatus 310. With such a configuration, the ranging accuracy can be further improved.

While the example of the control operation for preventing the vehicle from colliding with another vehicle has been described above, the present exemplary embodiment can also be applied to, for example, a control operation for performing automatic driving following another vehicle, and a control operation for performing automatic driving so as to prevent the vehicle from deviating from a lane. Furthermore, the photoelectric conversion system 300 is not limited to a vehicle, such as an owned vehicle, but is also applicable to, for example, a moving body (a moving apparatus) such as a ship, an aircraft, or an industrial robot. In addition, the photoelectric conversion system 300 is not limited to a moving body, but is also applicable to an apparatus that extensively use object recognition, such as an intelligent transportation system (ITS).

The present disclosure is not limited to the above-described exemplary embodiments and can be modified in various ways.

For example, an example where some of the components according to one of the exemplary embodiments are added to any other exemplary embodiment, and an example where some of the components according to one of the exemplary embodiments are replaced with some of the components according to any other exemplary embodiment are also included in the exemplary embodiments of the present disclosure.

The photoelectric conversion systems according to the above-described sixth and seventh exemplary embodiments are examples of the photoelectric conversion system to which any one of the photoelectric conversion apparatuses according to the exemplary embodiments can be applied. The photoelectric conversion system to which any one of the photoelectric conversion apparatuses according to the exemplary embodiments can be applied is not limited to the configurations illustrated in FIG. 17 and FIGS. 18A and 18B.

The above-described exemplary embodiment merely illustrate specific examples for carrying out the present disclosure, and the technical scope of the present disclosure should not be interpreted in a limitative manner by the exemplary embodiments. The present disclosure can be implemented in various forms without departing from the technical idea of the present disclosure or the principal features of the present disclosure.

According to the present disclosure, it is possible to improve the accuracy of an output signal from a photoelectric conversion apparatus.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-201214, filed Dec. 3, 2020, which is hereby incorporated by reference herein in its entirety.

What is claimed is:

1. An apparatus including a plurality of pixels arranged in an array, the apparatus comprising:
   a first group of pixels that are arranged in a first direction among the plurality of pixels;
   a first line to which the first group is connected;
   a second group of pixels that are arranged in the first direction among the plurality of pixels;
   a second line to which the second group is connected,
   wherein the first line is connected to a first source, and
   wherein the second line is connected to a second source; and
   a control circuit configured to
      perform control to increase a second current flowing through the second source during a period in which the control circuit performs control to decrease a first current flowing through the first source according to a change from a first readout mode to a second readout mode.

2. The apparatus according to claim 1,
   wherein the first line is connected to a first circuit, and
   wherein the second line is connected to a second circuit.

3. The apparatus according to claim 2,
   wherein each of the first line and the second line outputs a signal based on electric charge generated in the plurality of pixels,
   wherein the first circuit compares the signal output from the first line with a reference signal, and
   wherein the second circuit compares the signal output from the second line with the reference signal.

4. The apparatus according to claim 2, further comprising a circuit configured to perform a thinning-out operation for causing the first circuit to operate and preventing the second circuit from operating during a period in which the first circuit is operating.

5. The apparatus according to claim 1, wherein the pixels included in the first group and the pixels included in the second group are arranged in a same column of the plurality of pixels arranged in the array.

6. The apparatus according to claim 1, wherein the control circuit decreases a resistance of the second line while performing control to decrease the first current flowing through the first source.

7. The apparatus according to claim 1, wherein a difference between an amount of the decrease in the first current flowing through the first source and an amount of the increase in the second current flowing through the second source is less than the amount of the decrease or the amount of the increase.

8. The apparatus according to claim 1, wherein the first source and the second source are connected to a same reference source.

9. The apparatus according to claim 1,
   wherein the plurality of pixels is formed on a first substrate,
   wherein the first source and the second source are formed on a second substrate, and
   wherein a plurality of substrates including the first substrate and the second substrate is laminated.

10. A system comprising:
the apparatus according to claim 1; and
a processing circuit configured to generate an image by using a signal output from the apparatus.

11. A moving body comprising:
the apparatus according to claim 1; and
a control circuit configured to control a movement of the moving body by using a signal output from the apparatus.

12. The apparatus according to claim 1, wherein the control circuit is configured to perform control to increase the second current flowing through the second source during the period in which the control circuit performs control to decrease the first current flowing through the first source from the state in which the first current flows through the first source and the second current flows through the second source.

13. The apparatus according to claim 1, wherein the control circuit is configured to suppress a variation of a total amount of flowing current by changing the second current flowing through the second source during a change in the first current flowing through the first source.

14. The apparatus according to claim 13, wherein the control circuit is configured to suppress the variation of the total amount of flowing current by changing the second current flowing through the second source during the change in the first current flowing through the first source from the state in which the first current flows through the first source and the second current flows through the second source.

15. The apparatus according to claim 1, wherein an amount of data output from the plurality of pixels arranged in the array in the first readout mode is larger than an amount of data output from the plurality of pixels arranged in the array in the second readout mode.

16. The apparatus according to claim 1, wherein the first readout mode is an all pixels readout mode with a high resolution and a normal signal-to-noise ratio and the second readout mode is a column thinning-out mode with a low resolution and a high signal-to-noise ratio.

17. A method for driving an apparatus, the method comprising increasing a second current flowing through a second source during a period of decreasing a first current flowing through a first source according to a change from a first readout mode to a second readout mode,
wherein the apparatus includes:
a plurality of pixels arranged in an array,
a first group of pixels that are arranged in a first direction among the plurality of pixels,
a first line to which the first group is connected,
a second group of pixels that are arranged in the first direction among the plurality of pixels, and
a second line to which the second group is connected,
wherein the first line is connected to the first source, and
wherein the second line is connected to the second source.

18. The method according to claim 17, further comprising:
suppressing a variation of a total amount of flowing current by changing the second current flowing through the second source during a change in the first current flowing through the first source.

19. The method according to claim 17,
wherein the first line is connected to a first circuit, and
wherein the second line is connected to a second circuit.

20. The method according to claim 17, wherein the pixels included in the first group and the pixels included in the second group are arranged in a same column of the plurality of pixels arranged in the array.

21. The method according to claim 17,
wherein the performing control decreases a resistance of the second line while performing control to decrease the first current flowing through the first source.

22. The method according to claim 17, wherein an amount of data output from the plurality of pixels arranged in the array in the first readout mode is larger than an amount of data output from the plurality of pixels arranged in the array in the second readout mode.

23. An apparatus including a plurality of pixels arranged in an array, the apparatus comprising:
a first group of pixels that are arranged in a first direction among the plurality of pixels;
a first line to which the first group is connected;
a second group of pixels that are arranged in the first direction among the plurality of pixels;
a second line to which the second group is connected,
wherein the first line is connected to a first source, and
wherein the second line is connected to a second source; and
a control circuit configured to suppress a variation of a total amount of flowing current by changing the second current flowing through the second source during a change in the first current flowing through the first source according to a change from a first readout mode to a second readout mode.

24. The apparatus according to claim 23, wherein an amount of data output from the plurality of pixels arranged in the array in the first readout mode is larger than an amount of data output from the plurality of pixels arranged in the array in the second readout mode.

* * * * *